US012302526B2

(12) United States Patent
Johnson

(10) Patent No.: US 12,302,526 B2
(45) Date of Patent: *May 13, 2025

(54) TRANSPORTABLE DATACENTER

(71) Applicant: Digital Shovel Holdings Inc., Scarborough (CA)

(72) Inventor: Scot Arthur Johnson, Woodview (CA)

(73) Assignee: Digital Shovel Holdings Inc., Scarborough (CA)

( * ) Notice: Subject to any disclaimer, the term of this patent is extended or adjusted under 35 U.S.C. 154(b) by 37 days.

This patent is subject to a terminal disclaimer.

(21) Appl. No.: 18/128,324

(22) Filed: Mar. 30, 2023

(65) Prior Publication Data
US 2023/0309257 A1    Sep. 28, 2023

Related U.S. Application Data

(63) Continuation of application No. 17/993,948, filed on Nov. 24, 2022, now Pat. No. 11,647,605, which is a (Continued)

(30) Foreign Application Priority Data

Jul. 19, 2019    (WO) ................ PCT/CA2019/050998

(51) Int. Cl.
*H05K 7/14*    (2006.01)
*H05K 7/20*    (2006.01)

(52) U.S. Cl.
CPC ......... *H05K 7/1492* (2013.01); *H05K 7/1497* (2013.01); *H05K 7/20145* (2013.01); (Continued)

(58) Field of Classification Search
CPC .................................................. H05K 7/1497
See application file for complete search history.

(56) References Cited

U.S. PATENT DOCUMENTS 5,544,012 A * 8/1996 Koike ................ H05K 7/20572
165/122
5,653,070 A    8/1997 Seguin
(Continued)

FOREIGN PATENT DOCUMENTS

EP    2074337 A4    6/2012
EP    2900045 A1    7/2015
(Continued)

OTHER PUBLICATIONS

"Complaint For Patent Infringement including exhibits A-F" filed May 1, 2024. *Digital Shovel Holdings Inc.*, v. *RK Mission Critical, LLC, RK Mechanical, LLC, and RK Industries, LLC.* Civil Action No. 1:24-cv-01197 filed in the United States District Court for the District of Colorado. 219 pages.
(Continued)

*Primary Examiner* — Mukundbhai G Patel
(74) *Attorney, Agent, or Firm* — SMART & BIGGAR LP

(57) ABSTRACT

Several transportable datacenters are described. The transportable datacenters include transport systems allowing them to be transported between an assembly location and an operating location. The transportable datacenters also include a ventilation system for cooling processors positioned in racks in the datacenters. The ventilation system draws cold air from the environment, through processor bays containing the processors and then exhausts the air back to the environment.

22 Claims, 32 Drawing Sheets

Related U.S. Application Data continuation of application No. 17/400,869, filed on Aug. 12, 2021, now Pat. No. 11,540,414, which is a continuation of application No. PCT/CA2020/050201, filed on Feb. 14, 2020.

(60) Provisional application No. 62/876,900, filed on Jul. 22, 2019, provisional application No. 62/806,262, filed on Feb. 15, 2019.

(52) U.S. Cl.
CPC ..... *H05K 7/20172* (2013.01); *H05K 7/20718* (2013.01); *H05K 7/20736* (2013.01); *H05K 7/20836* (2013.01); *H05K 7/20209* (2013.01)

(56) References Cited

U.S. PATENT DOCUMENTS

| | | |
|---|---|---|
| 6,665,582 B1 | 12/2003 | Moritz et al. |
| 7,170,745 B2 | 1/2007 | Bash et al. |
| 7,278,273 B1 | 10/2007 | Whitted et al. |
| 7,500,911 B2 | 3/2009 | Johnson et al. |
| 7,724,513 B2 | 5/2010 | Coglitore et al. |
| 7,738,251 B2 | 6/2010 | Clidaras et al. |
| 7,800,900 B1 | 9/2010 | Noteboom et al. |
| 7,854,652 B2 | 12/2010 | Yates et al. |
| 7,957,142 B2 | 6/2011 | Noteboom et al. |
| 7,971,446 B2 | 7/2011 | Clidaras et al. |
| 7,990,710 B2 | 8/2011 | Hellriegel et al. |
| 8,233,270 B2 | 7/2012 | Pierson et al. |
| 8,320,128 B2 | 11/2012 | Wei |
| 8,659,895 B1* | 2/2014 | Carlson .............. H05K 7/20745 361/695 |
| 8,854,809 B2 | 10/2014 | Neumann et al. |
| 9,345,167 B2 | 5/2016 | Hwang |
| 9,380,734 B2 | 6/2016 | Chang |
| 9,414,531 B1 | 8/2016 | Towner et al. |
| 9,442,541 B2 | 9/2016 | Pofahl et al. |
| 9,622,387 B1 | 4/2017 | Czamara |
| 9,795,062 B1 | 10/2017 | Ross et al. |
| 9,839,163 B2 | 12/2017 | Keisling et al. |
| 9,930,814 B2 | 3/2018 | Endo et al. |
| 10,037,061 B1* | 7/2018 | Panchapakesan .. H05K 7/20836 |
| 10,582,635 B1 | 3/2020 | Ross |
| 11,337,339 B2 | 5/2022 | Pichai et al. |
| 11,540,414 B2 | 12/2022 | Johnson |
| 11,647,605 B2 | 5/2023 | Johnson |
| 2003/0050003 A1 | 3/2003 | Charron |
| 2004/0000815 A1 | 1/2004 | Pereira |
| 2005/0022967 A1 | 2/2005 | Hall |
| 2005/0168945 A1 | 8/2005 | Coglitore |
| 2005/0259383 A1 | 11/2005 | Ewing et al. |
| 2007/0171613 A1 | 7/2007 | Mcmahan et al. |
| 2008/0064317 A1 | 3/2008 | Yates et al. |
| 2008/0244052 A1 | 10/2008 | Bradicich et al. |
| 2008/0245083 A1 | 10/2008 | Tutunoglu et al. |
| 2009/0251860 A1 | 10/2009 | Belady et al. |
| 2009/0255653 A1* | 10/2009 | Mills .................. H05K 7/20736 165/104.34 |
| 2009/0295167 A1 | 12/2009 | Clidaras et al. |
| 2010/0130117 A1 | 5/2010 | Larsen |
| 2011/0235244 A1 | 9/2011 | Mills et al. |
| 2012/0063082 A1 | 3/2012 | Chang et al. |
| 2012/0129442 A1 | 5/2012 | Wei |
| 2012/0132554 A1* | 5/2012 | Wei ...................... H05K 7/1497 206/320 |
| 2012/0142265 A1 | 6/2012 | Wei |
| 2012/0201003 A1 | 8/2012 | Shimasaki et al. |
| 2012/0276834 A1 | 11/2012 | Peng et al. |
| 2013/0050923 A1 | 2/2013 | Wei |
| 2016/0113157 A1* | 4/2016 | Bao ........................ A47B 81/00 312/198 |
| 2017/0126054 A1 | 5/2017 | White et al. |
| 2019/0335626 A1 | 10/2019 | Shelnutt et al. |
| 2020/0033837 A1 | 1/2020 | Simmons et al. |
| 2021/0014997 A1 | 1/2021 | Johnson |
| 2021/0378131 A1 | 12/2021 | Johnson |

FOREIGN PATENT DOCUMENTS

| | | |
|---|---|---|
| EP | 2074337 B1 | 5/2019 |
| JP | 2012032107 A | 2/2012 |
| JP | 2015207226 A | 11/2015 |
| TW | 201526774 A | 7/2015 |
| WO | 2019111021 A1 | 6/2019 |
| WO | 2019173927 A1 | 9/2019 |
| WO | 2020163939 A1 | 8/2020 |
| WO | 2020163968 A2 | 8/2020 |

OTHER PUBLICATIONS

Norouzi-Khangah et al., "Performance assessment of cooling systems in data Methodology and application of a new thermal metric", Elsevier, Case Studies Engineering, vol. 8, pp. 152-163, Jul. 2, 2016.

Document relating to International Application No. PCT/CA2019/050998, dated Oct. 18, 2019 (International Search Report and Written Opinion), 8 pages.

Document relating to International Application No. PCT/CA2020/050201, dated Aug. 5, 2020 (International Search Report and Written Opinion), 17 pages.

Ashrae TC9.9, "Data Center Power Equipment Thermal Guidelines and Best Practices", ASHRAE Technical Committee (TC) 9.9 Mission Critical Facilities, Data Centers, Technology Spaces, and Electronic Equipment, pp. 1-60. Whitepaper, 2016.

ASHRAE Journal, "Filters & Insultation", pp. 14 and 18, Mar. 2012.

Kishor Khankari, "Rack Enclosures a Crucial Link in Airflow Management in Data Centers", ASHRAE Journal, pp. 48-51, Aug. 2009.

ASHRAE Journal, When is enough, enough? IKK or Chillventa—either way a change is likely. ASHRAE Journal, vol. 48, Issue 12, Dec. 2006, p. 6. American Society of Heating, Refrigerating, and Air-Conditioning Engineers, Inc. (ASHRAE), Gale Academic OneFile, link.gale.com/apps/doc/A156136283/AONE?u=tplmain&SID=bookmark-AONE&xid=c2680384.

ASHRAE Journal, "Companies Build Mobile Modular Data Center", p. 8, Jul. 2016.

Michael Rutberg et al. "Data Center Cooling", ASHRAE Journal, pp. 82-86, Oct. 2013.

Donald L. Beaty et al., "Changing Landscape of Data Centers Part 4: Future Disruptive ITE and Paradigms", ASHRAE Journal, pp. 78-84, Sep. 2017.

ANSI/ASHRAE/IES Standard 90.1-2013, "Energy Standard for Buildings Except Low-Rise Residential Buildings (SI Edition)", 278 pages, Atlanta, Georgia, 2013.

Michael Vaughn, "2007-2008 ASHRAE Research Report", ASHRAE Journal, pp. 69-80, Oct. 2008.

Donald L. Beaty et al., "Changing Landscape of Data Centers Part 1: Information Technology Equipment", ASHRAE Journal, pp. 96-101, Mar. 2017.

Roger Schmidt et al., Increasing Energy Efficiency in Data Centers, ASHRAE Journal, pp. 18-24, Dec. 2007.

Mukesh K. Khattar, "Free Cooling for Data Center", ASHRAE Journal, pp. 60-68, Oct. 2014.

ASHRAE Journal, Industry News, "Facebook Uses 100% OA to Cool", p. 6, Nov. 2013.

BSR/ASHRAE Standard 90.4P 3rd ISC Public Review Draft, "Energy Standard for Data Centers", Third ISC Public Review, 80 pages, Atlanta, Georgia, Jan. 2016.

Donald L. Beaty et al., "De-Risking Data Center Temperature Increases, Part 1", ASHRAE Journal, pp. 74-82, Jan. 2016.

Don Beaty, "Data Centers and Comfort Cooling", ASHRAE Journal, pp. 86-90, Oct. 2012.

Mukesh K. Khattar, "Data Center Retrofit Heat Containment and Airflow Management", ASHRAE Journal, pp. 40-19, Dec. 2010.

(56) References Cited

OTHER PUBLICATIONS

Robin A. Steinbrecher et al., "Data Center Environments ASHRAE's Evolving Thermal Guidelines", ASHRAE Journal, pp. 42-49, Dec. 2011.

Jeff Sloan, "Data Center Dilemma", ASHRAE Journal, pp. 62-67, Mar. 2013.

Don Fisher et al., "90.1 and Designing High Performance Commercial Kitchen Ventilation Systems", ASHRAE Journal, pp. Nov. 12-24, 2014.

Donald L. Beaty et al., "Changing Landscape of Data Centers Part 2: ITE Thermal Design", ASHRAE Journal, pp. 78-82, May 2017.

Matey, Michael A, Office Action, issued in co-pending U.S. Appl. No. 16/791, 528, dated Jun. 7, 2022, USPTO, 19 pages.

Extended European Search Report (EESR), issued in European App. No. 20755829.7, dated Oct. 17, 2022, EPO, 13 pages.

Motion to Dismiss Plaintiff's Complaint For Patent Infringement by Defendants RK Industries, LLC, RK Mechanical, LLC, RK Mission Critical, LLC., filed Jun. 25, 2024. 378 pages.

Brief in Opposition to Motion to Dismiss Plaintiff's Complaint For Patent Infringement filed by Plaintiff Digital Shovel Holdings Inc.. ( Attachments: # 1 Exhibit A—U.S. Pat. No. 11,910,557 File History Excerpt, # 2 Exhibit B—U.S. Pat. No. 11,540,414 File History Excerpt, # 3 Exhibit C—U.S. Pat. No. 11,647,605 File History Excerpt, # 4 Exhibit D—Am. Axle, 15-1168-GBW ), filed Jul. 16, 2024. 378 pages.

Reply to Response to 22 Motion to Dismiss Plaintiff's Complaint For Patent Infringement (Defendants Reply In Support of Their Motion to Dismiss) filed by Defendants RK Industries, LLC, RK Mechanical, LLC, RK Mission Critical, LLC. Filed Aug. 5, 2024. 13 pages.

Notice of Supplemental Authorities in Support of re: 24 Brief in Opposition to Motion, by Plaintiff Digital Shovel Holdings Inc. (Attachments: # 1 Exhibit A—22-1654 Opinion), filed Sep. 18, 2024. 17 pages.

"Sun Modular Datacenter" Retrieved from https://en.wikipedia.org/w/index.php?title=Sun_Modular_Datacenter&oldid=1206916707 . [Retrieved Sep. 20, 2024].

"Defendant's obviousness arguments of U.S. Pat. No. 11,540,414", Exhibit 414-103, filed Nov. 13, 2024, Civil Action No. 1:24-cv-01197, 107 pages.

"Defendant's obviousness arguments of U.S. Pat. No. 11,910,557", Exhibit 557-103, filed Nov. 13, 2024, Civil Action No. 1:24-cv-01197, 82 pages.

"Defendants' Disclosure of Initial Invalidity Contentions," filed Nov. 13, 2024. *Digital Shovel Holdings Inc.*, v. *RK Mission Critical, LLC, RK Mechanical, LLC, and RK Industries, LLC*. Civil Action No. 1:24-cv-01197 filed in the United States District Court for the District of Colorado. 17 pages.

"Defendant's obviousness arguments of U.S. Pat. No. 11,647,605", Exhibit 605-103, filed Nov. 13, 2024, Civil Action No. 1:24-cv-01197, 93 pages.

"Introduction to Mobile Mining Farm—Bitmain ANTBOX", Aug. 27, 2018, Eastshore Mining Devices, 47 pages, [online] Downloaded on Nov. 25, 2024 from: https://www.eastshoremining.com/introduction-to-mobile-mining-farm-bitmain-antbox/.

The Bitcoin Mines of China, S. Chow and M. E. Peck, IEEE Spectrum, vol. 54, No. 10, pp. 46-53, Oct. 2017, DOI: 10.1109/MSPEC.2017.8048840. [online] Online summary, downloaded Nov. 25, 2024 from https://ieeexplore.ieee.org/document/8048840, Full article: IEEE Spectrum Oct. 2017, downloaded Nov. 25, 2024.

"The Venturi effect and how it affects your data center efficiency," - ALFA Laval White Paper, Feb. 2016 , [online] Downloaded Nov. 25, 2024 from https://www.alfalaval.com/globalassets/documents/local/united-states/data-centers/white-paper_venturi-effect_usa.pdf, 9 pages.

"AntBox Movable Mining Farm," uploaded by ANTMINER, Aug. 16, 2018, YouTube [online] [video] —https://www.youtube.com/watch?v=T39vVW9JMxl [ Retrieved Dec. 2, 2024].

"42U Asic Mining Rig, " Reddit, May 17, 2018—[online] available at https://www.reddit.com/r/BitcoinMining/comments/8k6pq8/42u_asic_mining_rig/?rdt=51279 [ Retrieved Dec. 2, 2024].

"42U Asic Mining Rig" Imgur, May 17, 2018—[online] available at https://imgur.com/gallery/42u-asic-mining-rig-aWvZG4t [ Retrieved Dec. 2, 2024].

JP2015207226A—Hitachi Systems Ltd—Google Patents Translation [online]. [Retreived Nov. 20, 2024].

* cited by examiner

TRANSPORTABLE DATACENTER

CROSS-REFERENCE TO RELATED APPLICATIONS

This application is a Continuation of U.S. application Ser. No. 17/993,948 filed Nov. 24, 2022, which is a Continuation of U.S. application Ser. No. 17/400,869 filed Aug. 12, 2021 (now issued U.S. Pat. No. 11,540,414), which is a continuation of International Application No. PCT/CA2020/050201 filed Feb. 14, 2020, which claims the benefit of U.S. provisional Application No. 62/867,900 filed Jul. 22, 2019, and U.S. provisional Application No. 62/806,262 filed Feb. 15, 2019; and which claims priority to International Application No. PCT/CA2019/050998 filed Jul. 19, 2019. The disclosures set forth in the referenced applications are incorporated herein by reference in their entireties.

FIELD

The described embodiments relate to transportable datacenters.

BACKGROUND

Many datacenter facilities have very high power requirements and can require substantial cooling to maintain computing equipment within its acceptable operating conditions. It can be advantageous to locate such datacenter facilities in geographical locations with relatively low-cost electrical power, cold ambient air temperatures, or a combination of both. In a datacenter, electrical power is used for two things: to power the many microprocessors within, and to drive cooling of the microprocessors to maintain a safe operating temperature.

Active cooling (i.e. using a chiller, condenser, pump, cooling towers, etc.) is one commonly used option for cooling the datacenter. This approach has drawbacks however, including high electrical power requirements, high equipment costs, and high maintenance costs.

The economics of data processing on a large scale often vary considerably based on the availability of low-cost power. Cold ambient air is desirable as an input to reduce electrical power consumption for cooling. The opportunity to exhaust heated air into the atmosphere is also desirable.

Conventional datacenter design has drawbacks that inhibit such designs from use in transportable datacenter facilities. For example, conventional datacenter design generally involves air intake from fans or an air conditioning unit via a raised floor having gratings generally in front of each rack in the cold air plenum, and air exhausted upwards and into a return air plenum in the ceiling. Such a design itself presents numerous challenges for use in transportable datacenter facilities. For example, access to the server racks in the datacenter requires operator access to the cold air plenum directly in front of the processors in the rack, and operator access to the hot air plenum directly behind the processors in the rack. The requirements for operator access in datacenters having a cold air plenum beneath the raised floor and the hot air plenum above the server racks mean that frequently the cold air plenum and the warm plenum do not have barriers defining the plenums as between different racks. It is desirable to provide a more practical design for cooling a transportable datacenter.

The location of low-cost power and cold ambient air is often distant from population centers and areas of industrial manufacturing, making the utilization of the low-cost power and cold ambient air difficult. It is desirable to provide transportable datacenter facilities that can be manufactured in convenient manufacturing facilities and then transported to appropriate locations where they can more efficiently be put into operation.

SUMMARY

In accordance with aspects of this invention, there are transportable datacenters and methods of assembling transportable data centers to address the above problems.

In a first aspect, some embodiments of the invention provide a transportable datacenter comprising: a housing having air intake openings from for receiving air from an external environment and air exhaust openings for exhausting air to the external environment; a plurality of racks, each rack having a plurality of processor bays, each processor bay having a front face and a rear face; an electric power system for providing electric power at each processor bay; a data network for providing data communications at each processor bay; a cold air plenum between the air intake openings and the front faces of the processor bays; at least one hot air plenum between the rear faces of the processor bays and the air exhaust opening, wherein the hot air plenum is substantially fluidically isolated from the cold air plenum; a ventilation system to draw air progressively through the air intake openings, the cold air plenum, the processor bays, the hot air plenum and the air exhaust openings; and a transport system for transporting the transportable datacenter.

In at least one embodiment, the air intake openings may be on a first sidewall.

In at least one embodiment, the air exhaust openings may be on a second sidewall.

In at least one embodiment, the air exhaust openings may be on a roof.

In at least one embodiment, the air intake openings may be on a roof.

In at least one embodiment, the air intake openings may be on a second sidewall.

In at least one embodiment, the air intake openings may be on the roof.

In at least one embodiment, one or more hot air mixing fans may blow air through an at least one air exhaust opening into an at least one intake opening through ducting.

In at least one embodiment, the ventilation system may include exhaust fans mounted in at least some of the air exhaust openings.

In at least one embodiment, the exhaust fans may be on an outside of the transportable datacenter.

In at least one embodiment, the ventilation system may include intake fans mounted in at least some of the air intake openings.

In at least one embodiment, the intake fans may be on an outside of the transportable datacenter.

In at least one embodiment, the ventilation system may include processor intake cooling fans mounted to a front face of at least some of the processor, adjacent the cold air plenum.

In at least one embodiment, the ventilation system may include processor exhaust cooling fans mounted to a rear face of at least some of the processor, adjacent the hot air plenum.

In at least one embodiment, at least some of the racks may be arranged in pairs, with the rear faces of the processor bays in each rack in a pair adjacent to the same hot air plenum.

In at least one embodiment, the processor bays may have an exhaust flap.

In at least one embodiment, the processor bays may be arranged at an oblique angle to provide a straighter air flow path through the transportable datacenter.

In at least one embodiment, the racks may be arranged at an oblique angle to provide a straighter air flow path through the transportable datacenter.

In at least one embodiment, the housing may be a freight container.

In at least one embodiment, the housing may be an intermodal shipping container.

In at least one embodiment, the embodiment may further include a central fan controller for controlling the operation of the ventilation system in response to one or more measured temperatures.

In at least one embodiment, the housing may be a transportable shipping container.

In at least one embodiment, the transport system may include mounts for mounting the housing on a transport platform.

In at least one embodiment, the mounts may be configured to allow the transportable datacenter to be stacked on top of another similar transportable datacenter.

In at least one embodiment, the transport system may include wheels mounted to the transportable datacenter.

In at least one embodiment, the wheels may be detachable.

In at least one embodiment, the power system may have a bus bar attached to each rack in the racks.

In a second aspect, some embodiments of the invention provide a transportable datacenter comprising: a housing having air intake openings for receiving air from an external environment and air exhaust openings for exhausting air to the external environment; a plurality of racks, each rack having a plurality of processor bays, each processor bay having a front face and a rear face; an electric power system for providing electric power at each processor bay; a data network for providing data communications at each processor bay; a cold air plenum between the air intake openings and the front faces of the processor bays; at least one hot air plenum between the rear faces of the processor bays and the air exhaust opening; a ventilation system to draw air progressively through the air intake openings, the cold air plenum, the processor bays, the hot air plenum and the air exhaust openings, and wherein the ventilation system includes one or more hot air mixing fans for blowing air from one or more hot air plenums into the cold air plenum; and a transport system for transporting the transportable datacenter.

In at least one embodiment, the air intake openings may be on a first sidewall.

In at least one embodiment, the air exhaust openings may be on a second sidewall.

In at least one embodiment, the air exhaust openings may be on a roof.

In at least one embodiment, the air intake openings may be on a roof.

In at least one embodiment, the air intake openings may be on a second sidewall.

In at least one embodiment, the air intake openings may be on the roof.

In at least one embodiment, one or more hot air mixing fans may blow air through an at least one air exhaust opening into an at least one intake opening through ducting.

In at least one embodiment, the ventilation system may include exhaust fans mounted in at least some of the air exhaust openings.

In at least one embodiment, the exhaust fans may be on an outside of the transportable datacenter.

In at least one embodiment, the ventilation system may include intake fans mounted in at least some of the air intake openings.

In at least one embodiment, the intake fans may be on an outside of the transportable datacenter.

In at least one embodiment, the ventilation system may include processor intake cooling fans mounted to a front face of at least some of the processor, adjacent the cold air plenum.

In at least one embodiment, the ventilation system may include processor exhaust cooling fans mounted to a rear face of at least some of the processor, adjacent the hot air plenum.

In at least one embodiment, at least some of the racks may be arranged in pairs, with the rear faces of the processor bays in each rack in a pair adjacent to the same hot air plenum.

In at least one embodiment, the processor bays may have an exhaust flap.

In at least one embodiment, the processor bays may be arranged at an oblique angle to provide a straighter air flow path through the transportable datacenter.

In at least one embodiment, the racks may be staggered to provide a straighter air flow path through the transportable datacenter.

In at least one embodiment, the housing may be a freight container.

In at least one embodiment, the housing may be an intermodal shipping container.

In at least one embodiment, the embodiment may further include a central fan controller for controlling the operation of the ventilation system in response to one or more measured temperatures.

In at least one embodiment, the housing may be a transportable shipping container.

In at least one embodiment, the transport system may include mounts for mounting the housing on a transport platform.

In at least one embodiment, the mounts may be configured to allow the transportable datacenter to be stacked on top of another similar transportable datacenter.

In at least one embodiment, the transport system may include wheels mounted to the transportable datacenter.

In at least one embodiment, the wheels may be detachable.

In at least one embodiment, the power system may have a bus bar attached to each rack in the racks.

In a third aspect, some embodiments of the invention provide a method of assembling a transportable datacenter, including: providing a housing, wherein the housing includes: one or more air intake openings; and one or more air exhaust openings, installing a plurality of racks in the transportable datacenter, each rack having a plurality of processor bays, each of the processor bays having a front face and a rear face; substantially fluidically isolating a cold air plenum from one or more hot air plenums, wherein front faces of the processor bays are adjacent the cold air plenum and the rear faces of the processor bays are adjacent the hot air plenum; installing a ventilation system for progressively drawing air from an environment of the transportable datacenter through the air intake openings, the cold air plenum, the processor bays, the hot air plenums and through the air exhaust openings back to the environment.

In at least one embodiment, the one or more air intake openings may be on a first sidewall.

In at least one embodiment, the one or more air exhaust openings may be on a second sidewall.

In at least one embodiment, the one or more air exhaust openings may be on a roof.

In at least one embodiment, the one or more air intake openings may be on a roof.

In at least one embodiment, the one or more air intake openings may be on a second sidewall.

In at least one embodiment, the one or more air intake openings may be on the roof.

In at least one embodiment, one or more hot air mixing fans may blow air through an at least one air exhaust opening into an at least one intake opening through ducting.

In at least one embodiment, the ventilation system may include exhaust fans mounted in at least some of the air exhaust openings.

In at least one embodiment, the one or more exhaust fans may be on an outside of the transportable datacenter.

In at least one embodiment, the ventilation system may include one or more intake fans mounted in at least some of the one or more air intake openings.

In at least one embodiment, the one or more intake fans may be on an outside of the transportable datacenter.

In at least one embodiment, the method of assembly may further comprise installing one or more processors; wherein the ventilation system includes processor intake cooling fans that may be mounted to a front face of the at least one processors, adjacent the cold air plenum.

In at least one embodiment, the ventilation system may include processor exhaust cooling fans mounted to a rear face of the at least one processors, adjacent the hot air plenum.

In at least one embodiment, the method of assembly may further comprise a plurality of racks and a plurality of hot air plenums, wherein at least some of the racks may be arranged in pairs, with the rear faces of the processor bays in each rack in a pair adjacent to the same hot air plenum.

In at least one embodiment, the processor bays may have an exhaust flap.

In at least one embodiment, the processor bays may be arranged at an oblique angle to provide a straighter air flow path through the transportable datacenter.

In at least one embodiment, the racks may be staggered to provide a straighter air flow path through the transportable datacenter.

In at least one embodiment, the housing may be a freight container.

In at least one embodiment, the housing may be an intermodal shipping container.

In at least one embodiment, the method of assembly may further include a central fan controller for controlling the operation of the ventilation system in response to one or more measured temperatures.

In at least one embodiment, the housing may be a transportable shipping container.

In at least one embodiment, the transport system may include mounts for mounting the housing on a transport platform.

In at least one embodiment, the mounts may be configured to allow the transportable datacenter to be stacked on top of another similar transportable datacenter.

In at least one embodiment, the transport system may include wheels mounted to the transportable datacenter.

In at least one embodiment, the wheels may be detachable.

In at least one embodiment, the power system may have a bus bar attached to each rack in the racks.

In a fourth aspect, some embodiments provide a transportable datacenter, comprising: a housing having air intake openings for receiving air from an external environment and air exhaust openings for exhausting air to the external environment; a plurality of racks, each rack having a plurality of processor bays, each processor bay having a front face and a rear face; an electric power system for providing electric power at each processor bay; a data network for providing data communications at each processor bay; a cold air plenum between the air intake openings and the front faces of the processor bays; at least one hot air plenum between the rear faces of the processor bays and the air exhaust opening, wherein the hot air plenum is substantially fluidically isolated from the cold air plenum; a ventilation system to draw air progressively through the air intake openings, the cold air plenum, the processor bays, the hot air plenum and the air exhaust openings, the ventilation system comprising one or more fans outside the housing, the one or more fans having a larger diameter than the air intake openings and the air exhaust openings; and a transport system for transporting the transportable datacenter.

In a fifth aspect, some embodiments provide a method of assembling a transportable datacenter, including: providing a housing, wherein the housing includes: one or more air intake openings; and one or more air exhaust openings, installing a plurality of racks in the transportable datacenter, each rack having a plurality of processor bays, each of the processor bays having a front face and a rear face; substantially fluidically isolating a cold air plenum from one or more hot air plenums, wherein front faces of the processor bays are adjacent the cold air plenum and the rear faces of the processor bays are adjacent the hot air plenum; installing a ventilation system for progressively drawing air from an environment of the transportable datacenter through the air intake openings, the cold air plenum, the processor bays, the hot air plenums and through the air exhaust openings back to the environment, the ventilation system comprising one or more fans, the one or more fans having a larger diameter than the air intake openings and the air exhaust openings.

In a sixth aspect, some embodiments provide a power distribution panel for a rack of processors in a transportable datacenter, the transportable datacenter comprising an intake sidewall and an exhaust sidewall, comprising: a housing comprising a back surface, a top surface, a bottom surface and one or more sides, the housing defining an open end opposite the back surface, the back surface for coupling circuit elements to the housing, the housing comprising one or more processor circuit access openings and one or more main circuit access openings; the housing defining an open front end for accessing the one or more circuit elements, the housing defining an interior of the power distribution panel, the housing shaped to define a clearance between the power distribution housing and the intake sidewall of the transportable datacenter, the housing arranged proximal to an end of the rack; one or more electric circuits disposed within the interior of the housing, each of the one or more electric circuits comprising: a circuit element in the one or more circuit elements; an input electrically connected to the circuit element, the input electrically connected to a main circuit through the one or more main circuit access openings; and an output electrically connected to the circuit element, the output electrically connected to a processor circuit through the one or more processor circuit access openings.

In at least one embodiment, the housing may further comprise a front surface; and the one or more electric circuits may be attached to the front surface.

In at least one embodiment, the housing may further comprise a front surface; and the one or more electric circuits may be attached to the rear surface within the interior of the housing.

In at least one embodiment, the housing may be generally shaped like a triangular prism.

In at least one embodiment, the housing may be attached to the end of the rack.

In at least one embodiment, the housing may be attached to the end of the rack using a mounting bracket, the mounting bracket comprising: a first flange for attaching to the rack; a first spacer extending from the first flange; a standoff extending from the first spacer; a second spacer extending from the standoff; and a second flange extending from the second spacer for attaching to the rack.

In at least one embodiment, the first spacer may extend further from the rack than the second spacer.

In at least one embodiment, the power distribution panel may further comprise: a door substantially covering the open front end of the housing.

In at least one embodiment, the one or more circuit elements may comprise: one or more processor circuit breakers; and one or more main circuit breakers.

In at least one embodiment, the housing may be shaped to define a clearance of at least 36 inches.

In a seventh aspect, some embodiments provide a power distribution system for a plurality of processors in a rack in a transportable datacenter, the transportable datacenter comprising an intake sidewall and an exhaust sidewall, comprising: a plurality of input circuits electrically connected to a power supply; a plurality of processor circuits, each of the plurality of processor circuits electrically connected to a processor in the plurality of processors; a power distribution panel comprising: a plurality of circuits for transmitting electrical power to the plurality of processors, the plurality of circuits positioned inside the power distribution panel, each circuit comprising: a processor circuit breaker attached to a back side of the power distribution panel; an input side in electrical connection with the processor circuit breaker; and an output side in electrical connection with the processor circuit breaker, the input side of each processor circuit breaker in electrical connection to an input circuit in the plurality of input circuits; the output side of each processor circuit breaker in direct electrical connection with an output circuit in the plurality of processor circuits.

In at least one embodiment, the power distribution panel may further comprise a plurality of main breakers, each main breaker connected between the input circuit and the plurality of processor circuits.

In at least one embodiment, the plurality of processor circuits may be manually controlled.

In at least one embodiment, the plurality of processor circuits may be remotely controlled by an optical coupler.

In an eighth aspect, some embodiments provide a cooling apparatus for a transportable datacenter, the transportable datacenter comprising an intake sidewall and an exhaust sidewall, comprising: an input pipe in fluid communication with a cooling liquid source; a pump, an input of the pump connected to the input pipe; a intermediate pipe in fluid communication with the pump, the intermediate pipe connected to an output of the pump; one or more output pipes in fluid communication with the intermediate pipe, a first end of each of the one or more output pipes connected to the intermediate pipe; and one or more nozzles, each nozzle connected at a second end of each of the one or more output pipes, the one or more nozzles for generating a liquid mist for evaporative cooling the transportable datacenter.

In a ninth aspect, some embodiments provide a cooling system for a transportable datacenter, comprising: a pump for pumping cooling liquid; one or more output pipes connected to the pump, each output pipe having a nozzle at a distal end, the nozzles for generating a liquid mist for evaporative cooling of the transportable datacenter; one or more sensors for measuring one or more environment values; a processor in communication with the electric motor and the sensor, the processor generally configured to: measure the one or more environment values using the one or more sensors; and operate the pump responsive to the one or more environment values.

In at least one embodiment, the one or more sensors may be at least one of a temperature sensor, an optical sensor, and a humidity sensor.

In at least one embodiment, the cooling system may further comprise: one or more valves, each valve connected between the pump and the distal end of the one or more output pipes; one or more actuators, each of the one or more actuators connected to a valve in the one or more valves; the processor may be further configured to: operate the one or more actuators responsive to the environment value.

In at least one embodiment, the one or more actuators may be solenoids.

In another aspect, some embodiments provide a transportable datacenter comprising: a housing having one or more air intake openings from for receiving air from an external environment and one or more air exhaust openings for exhausting air to the external environment; a plurality of racks, each rack having a plurality of processor bays, each processor bay in the plurality of processor bays having a front face and a rear face; an electric power system for providing electric power at each processor bay; a data network for providing data communications at each processor bay; a cold air plenum between the one or more air intake openings the front faces of the processor bays; at least one hot air plenum between the rear faces of the processor bays and the air exhaust opening, wherein the hot air plenum is fluidically isolated from the cold air plenum; a ventilation system to draw air progressively through the one or more air intake openings, the cold air plenum, the processor bays, the hot air plenum and the one or more air exhaust openings; and a transport system for transporting the transportable datacenter, wherein at least some to the racks are arranged in pairs, and at least some of the pairs of racks are arranged in a v-shaped configuration.

In at least one embodiment, the end of a first rack in the pair forms an angle with an end of a second rack in the pair.

In at least one embodiment, the v-shaped configuration reduces turbulence in air flow through the pairs of racks arranged in the v-shaped configuration.

In at least one embodiment, at least some of the processor bays are arranged at an oblique angle to provide a straighter air flow path through the transportable datacenter.

In at least one embodiment, at least some of the one or more air intake openings are on a first sidewall.

In at least one embodiment, at least some of the one or more air exhaust openings are on a second sidewall opposite the first sidewall.

In at least one embodiment, the v-shaped configuration reduces turbulence in air flow in the datacenter from the air intake openings, through the pairs of racks arranged in the v-shaped configuration, and to the air exhaust openings.

In at least one embodiment, some of the one or more air exhaust openings are on a roof.

In at least one embodiment, some of the one or more air intake openings are on a roof.

In at least one embodiment, one or more hot air mixing fans blow air through an at least one air exhaust opening into an at least one intake opening through ducting.

In at least one embodiment, the ventilation system includes exhaust fans mounted in at least some of the one or more air exhaust openings.

In at least one embodiment, the exhaust fans are on an outside of the transportable datacenter.

In at least one embodiment, the ventilation system includes intake fans mounted in at least some of the one or more air intake openings.

In at least one embodiment, the intake fans are on an outside of the transportable datacenter.

In at least one embodiment, at least two of the racks in the plurality of racks are arranged into one or more pairs of racks, with the rear faces of the processor bays in each rack in the pair adjacent to the same hot air plenum in the one or more hot air plenums.

In at least one embodiment, at least some of the processor bays have an exhaust flap for channeling air exhaust output from such processor bays into the hot air plenum.

In at least one embodiment, at least some of the exhaust flaps are angled based on proximity of the corresponding processor bays to the exhaust air outlets.

In at least one embodiment, the transportable datacenter further includes a central fan controller for controlling an operation of the ventilation system in response to one or more measured temperatures.

In at least one embodiment, the ventilation system includes one or more processor intake cooling fans adjacent the front face of at least some of the processor bays to direct air from the cold air plenum through the corresponding processor bay.

In at least one embodiment, the ventilation system includes processor exhaust cooling fans adjacent the rear faces of at least some of the processor bays to direct air from the corresponding processor bay into the hot air plenum.

BRIEF DESCRIPTION OF THE DRAWINGS

Various preferred embodiments of the present invention will now be described in detail with reference to the drawings, in which.

DESCRIPTION OF EXEMPLARY EMBODIMENTS

Figure 1:
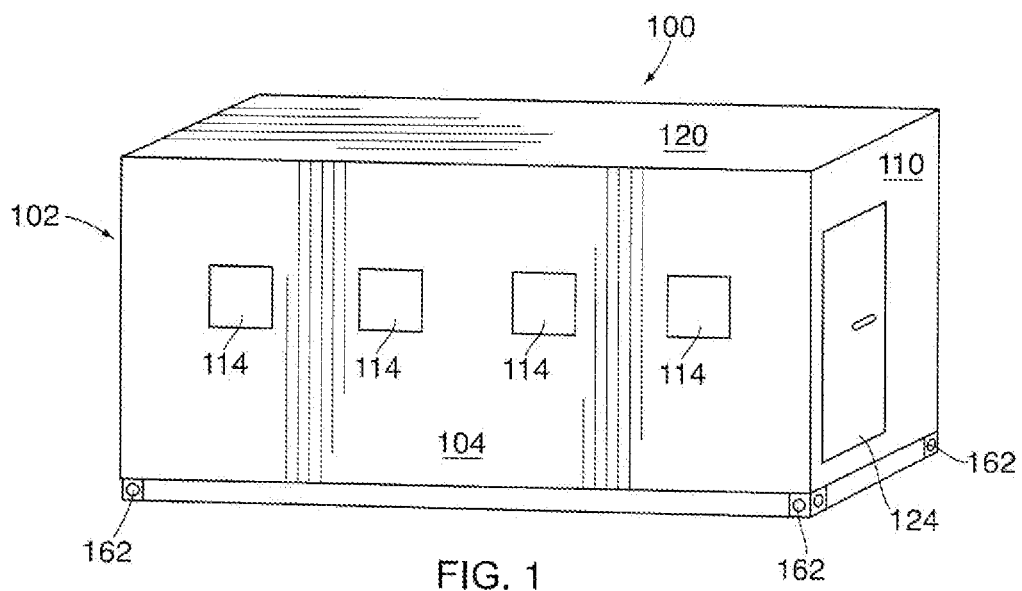
FIG. 1 is a perspective view of an example transportable datacenter.
Figure 2:
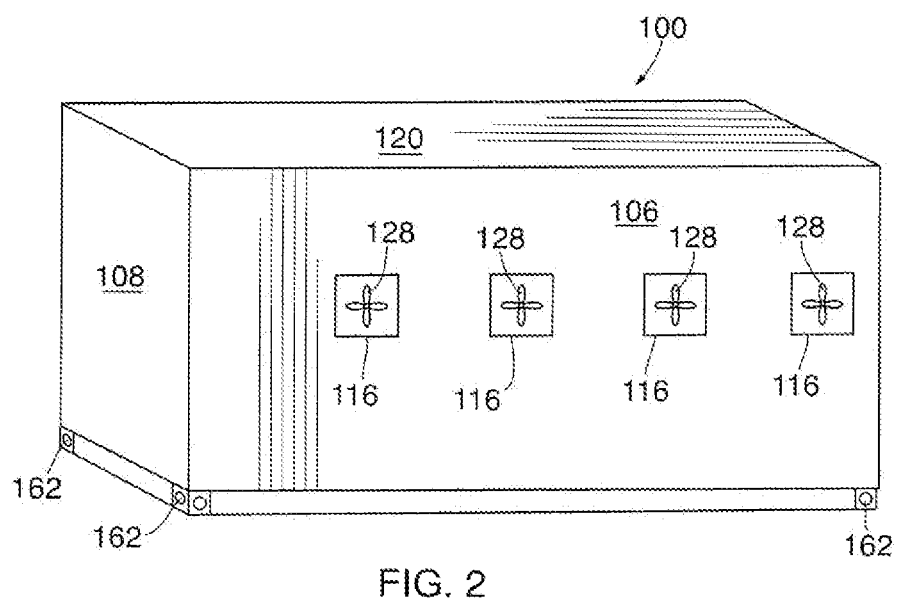
FIG. 2 is another perspective view of the transportable datacenter of FIG. 1.

Several example embodiments are described below. Numerous specific details are set forth in order to provide a thorough understanding of the example embodiments. However, it will be understood by those of ordinary skill in the art that the embodiments described herein may be practiced without these specific details. In other instances, well-known methods, procedures and components have not been described in detail so as not to obscure the embodiments described herein. Furthermore, this description and the drawings are not to be considered as limiting the scope of the embodiments described herein in any way, but rather as merely describing the implementation of the various embodiments described herein.

It should be noted that terms of degree such as "substantially", "about" and "approximately" when used herein mean a reasonable amount of deviation of the modified term such that the end result is not significantly changed. These terms of degree should be construed as including a deviation of the modified term if this deviation would not negate the meaning of the term it modifies.

In addition, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

Reference is first made to FIGS. 1-3A, which illustrate a transportable datacenter 100. The transportable datacenter 100 has a housing 102 which, in this example, is a transportable shipping container having sidewalls 104 and 106, end walls 108 and 110, a floor 118 and a ceiling or roof 120. The housing 102 may be a typical shipping container suitable for transport by truck, rail or boat. The housing 102 will typically be made of rigid, weather resistant material capable of withstanding an outdoor environment. The housing 102 of the transportable datacenter provides a generally weather resistant and enclosed volume in which other elements of the transportable datacenter are installed. In some embodiments, the housing may be freight container or a transportable intermodal container compliant with a corresponding standard such as ISO 668 or ISO 1496. In some cases, multiple transportable datacenters may be stackable one atop another.

Transportable datacenter 100 has a ventilation system for cooling processors that may be installed in the transportable datacenter. The cooling system may also serve generally to provide ventilation through the transportable datacenter. Ventilation is provided through the transportable datacenter 100 by air flowing through datacenter from an air intake to an air exhaust, typically from one sidewall to the opposing sidewall. In transportable datacenter 100, ventilation is provided from sidewall 104 to sidewall 106. Sidewall 104 having the air intake may be referred to as the intake side. The sidewall 106 having the air exhaust may be referred to as the exhaust side.

Air intake sidewall 104 has one or more air intake openings 114 to allow intake of cool air from the environment. Each of the intake openings 114 will typically have a filter or other protective element installed in the intake opening to reduce the flow of dirt, dust and other particulate matter and contaminants into the transportable datacenter 100. The air intake openings may have baffles or other physical protective elements to reduce the flow of rain and other materials into the transportable datacenter 100. In some embodiments, some or all of the intake openings may have an air intake fan installed within them.

The intake openings may be sized identically or differently from one another, for example, as shown, intake opening 114a may be smaller than the intake openings 114b, 114c, and 114d.

The end wall 110 may have a door 124 that allows operator access into the transportable datacenter 100, typically into a cold air plenum 154.

Air exhaust sidewall 106 has air exhaust openings 116 to exhaust hot air from within transportable datacenter 100 to the environment. Each of the exhaust openings 116 will typically have an exhaust fan 128 installed within it. The exhaust openings may be sized identically or differently from one another. For example, as shown, exhaust opening 116a may be smaller than exhaust openings 116b, 116c, and 116d. As with the air intake openings, the air exhaust openings 116 may have a filters or baffles or both to protect the interior of the transportable datacenter from contamination.

A plurality of racks are installed in the interior of the transportable datacenter 100. While seven racks are shown in this example, other numbers of racks may similarly be installed in the transportable datacenter. Each rack 134 has a plurality of shelves 136, with each shelf 136 having a plurality of processor bays 138 having a front face 140 and a rear face 142. In operation, a processor 500 (FIG. 5) may be installed in each of the processor bays 138.

Figure 3A:
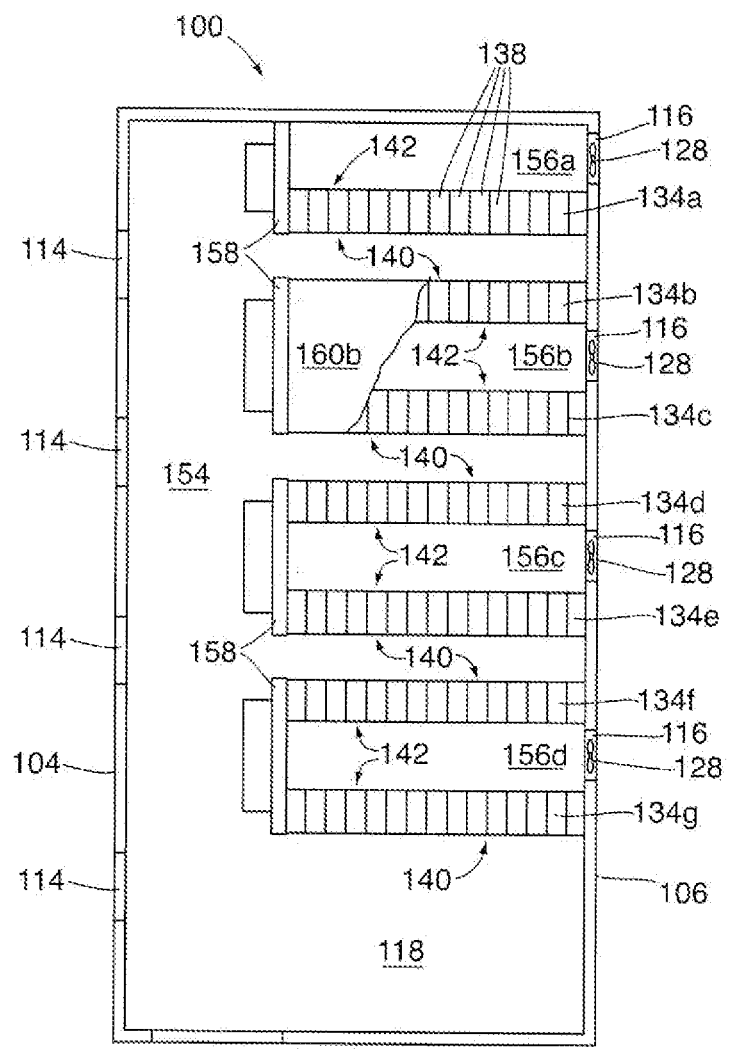
FIG. 3A is a cutaway top view of the transportable datacenter of FIG. 1.
Figure 3B:
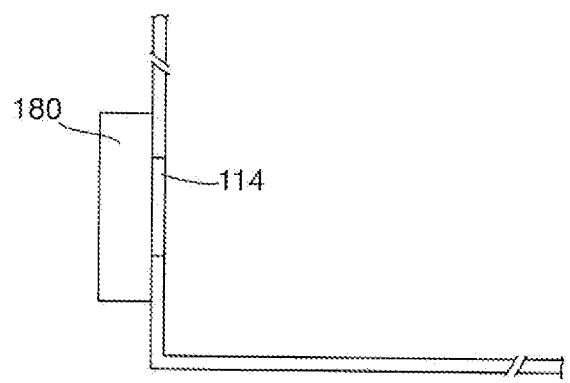
FIG. 3B is a cutaway portion view of the transportable datacenter of FIG. 1.

Reference is next made to FIG. 3B, which shows a cutaway portion view of a transportable datacenter 100. In one embodiment an external intake fan 180 is disposed outside of the transportable datacenter 100. The external intake fan 180 may have baffles or other physical protective elements to reduce the flow of rain and other materials into the transportable datacenter 100. In a similar fashion, the exhaust fans may be disposed outside of the transportable datacenter 100 as well. The external exhaust fans may have baffles or other physical protective elements to reduce the flow of rain and other materials into the transportable datacenter 100. As shown in FIG. 3B, the external intake fan 180 may be larger than the intake opening 114, which may allow for larger intake fans that intake a higher airflow rate, or a higher volume of air per minute than an intake fan disposed inside the intake opening 114. An external intake fan 180 that is larger than intake opening 114 may allow for increased laminar flow into the transportable datacenter. The external intake fan 180 may extend and be generally sized to the height of the transportable container 100. The external intake fan may extend beyond the perimeter of the transportable container 100 (not pictured in FIG. 3B).

It is generally understood that the cross-section of the fan blade path in an intake fan is circular, and that the intake fan may further comprise a fan housing. The external positioning of the intake fan 180 may allow for the intake opening to be completely covered with the cross-section of the fan blade path of intake fan 180, whereas an intake fan disposed within the intake opening 114 would include a housing partially obstructing the opening 114. Further, the external intake fan 180 may provide a higher airflow rate by ensuring the intake opening is covered by an inner portion of the cross-sectional of the fan blade path, the inner portion having a higher airflow than an outer portion of the cross-section of the fan blade path. The increased airflow in the inner portion of the cross-section of the fan blade path as compared to the outer portion of the cross-section of the fan blade path may be due to potential edge effects of the fan blades.

The external intake fan 180 may be installed on the outside of the transportable datacenter 100 when it arrives at an operational site. The installation of the external intake fan 180 may be done using fasteners, straps, or any known method. The external intake fan 180 may be removably attached to the transportable datacenter.

Similar to the above description of external intake fan 180, the exhaust fans may also be external to the transportable container and sized larger than the exhaust openings.

Figure 4A:
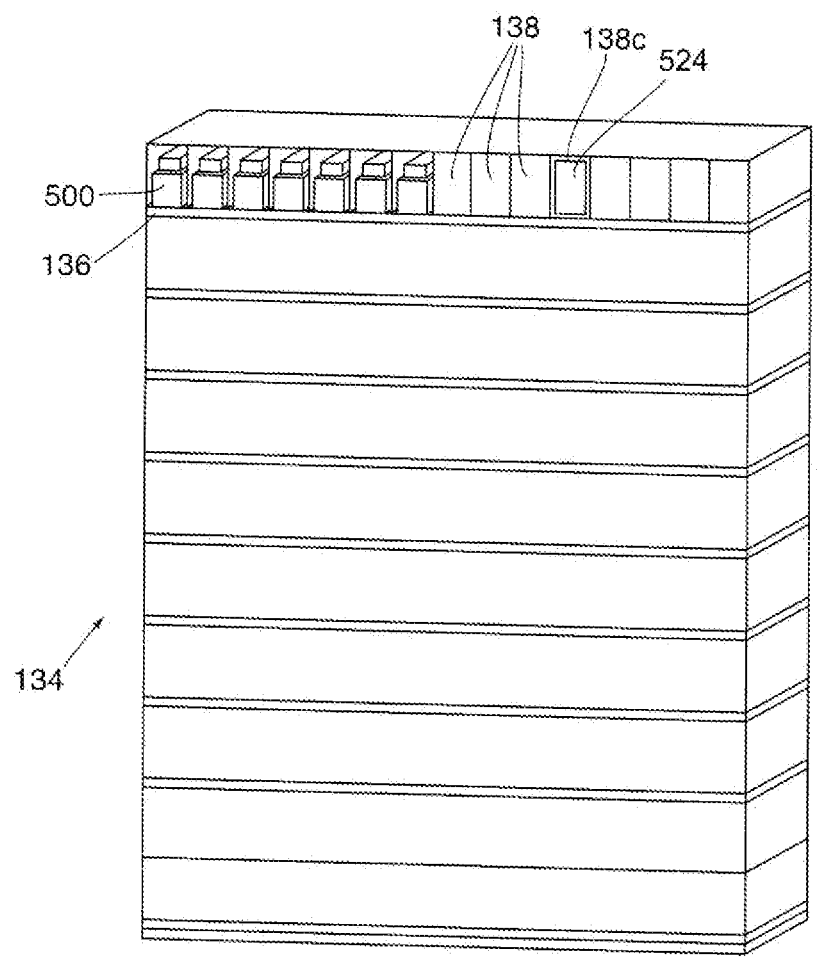
FIG. 4A illustrates an intake side view of a rack installed in the transportable datacenter of FIG. 1.

Reference is next made to FIG. 4A, which illustrates the intake side of a rack 134. The rack 134 has a plurality of shelves 136, each shelf 136 having a plurality of processor bays 138. Each processor bay 138 can accommodate a processor 500.

Each processor bay 138 may have a liner along the intake or exhaust side of the processor bay. The liner may be a thermally insulating foam liner, that provides thermal insulation between the hot plenum and the processor bay 138. The liner may line the processor bays 138, and optionally the plurality of shelves 136. The liner may act as a gasket between the processor bay 138 and a processor 500 to provide an air seal around the intake edges of the processor 500. The liner may have be made from a fire resistant material. The liner may provide a frictional attachment between the processor 500 and a processor bay 138.

Figure 4B:
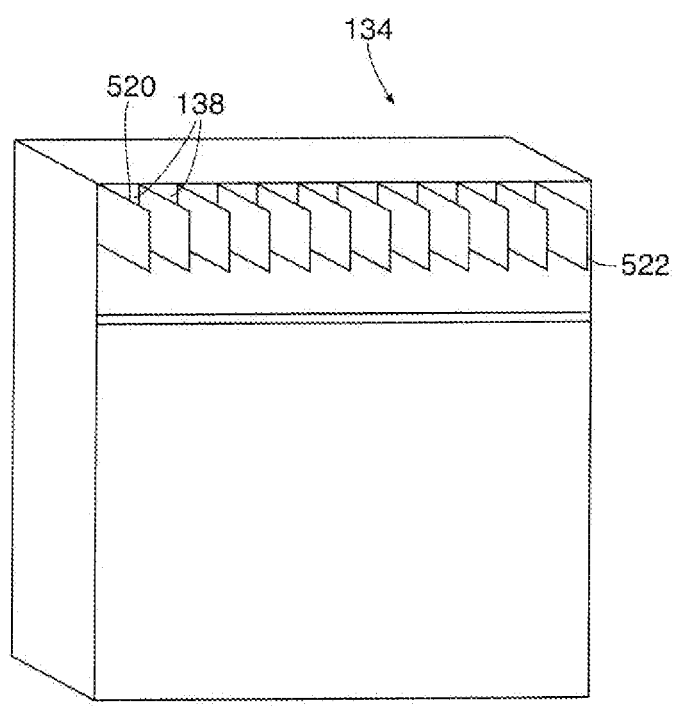
FIG. 4B illustrates an exhaust side view of a rack installed in the transportable datacenter of FIG. 1.

Referring to FIG. 4B, which illustrates the exhaust side of the rack 134 of FIG. 4A. The exhaust side panel 522 may have a thermally insulating foam liner similar to the foam liner of FIG. 4A. The exhaust side of rack 134 may have an exhaust flap 520 for a processor bay 138. While only flaps 520 for a single row are shown, there may be one flap for each processor bay in the entire rack. The exhaust flap 520 may extend from either side of the processor bay 138. The exhaust flap 520 may have a varying angle compared to other processor flaps relative to the rack. The angle of the flap 520 may be determined based on the airflow through the processor bay 138 and the proximity of the processor bay 138 to the exhaust opening of the hot air plenum. The exhaust flap is for channeling the air exhaust output into the hot air plenum.

Figure 5:
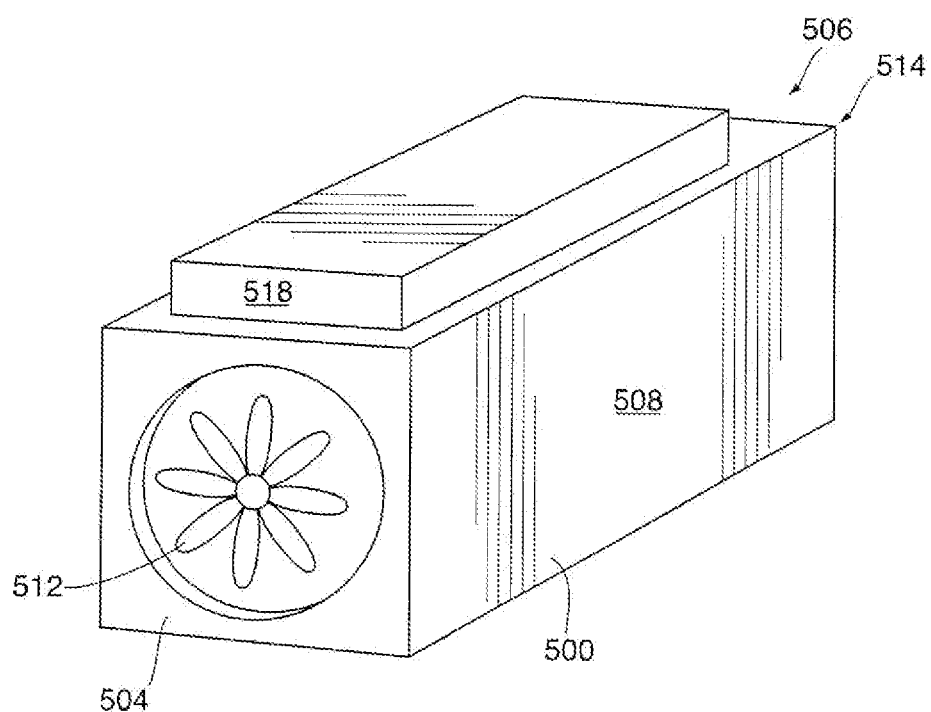
FIG. 5 illustrates a processor.

Referring also to FIG. 5, typically, a processor 500 will be a self-contained or substantially self-contained computing unit. Some processors may have an external power supply 518 that is mounted to or sits adjacent to the processor 500. Other processors may have an internal power supply or may not require a power supply. Each processor 500 is installed in the corresponding processor bay 138. In transportable datacenter 100, this is accomplished by placing in the processor (including, if present, its power supply or any other external components) in the processor bay 138. In other embodiments, a processor 500 may be fixedly mounted in a processor bay 138 with one or more fasteners. Each processor has a maximum cross-section from its front 504 to its rear 506. In some cases, the cross-sectional size of a processor may be generally consistent from front to rear, such as in the case of a processor that has a processor housing 508 that is generally shaped as a rectangular cuboid with three sets of opposing generally parallel faces. Each processor bay 138 is preferably shaped to conform to the cross sectional shape of the processor 500 that will be positioned in that processor bay 138. In some cases, an optional processor bay trim may be used to reduce or eliminate gaps between the processor and the sides of the processor bay. In some embodiments, the processor bays may not be specifically shaped to conform to the cross-sections of processors. In some embodiments, the processor bays may be positioned sufficiently close to one another that the majority of air flows through the processors positioned in the processor bays, and relatively little air flows between the processors. In some embodiments, the processor housings may contribute to the cooling of some or all of the processors and the processor bays may be spaced to allow airflow between the processor housings to cool the processor housings.

In some cases, during the operation of transportable datacenter 100, a processor bay 138 may not have a processor 500 installed in it. Such empty processor bays 138 may have a blanking panel 524 installed in them. The blanking panel 524 blocks all or most of the cross-section of the processor 138 to reduce or eliminate airflow through the empty processor bay 138 as is shown in relation to processor bay 138*e*.

In operation, each processor 500 generates heat, as is typical with computing devices. A processor 500 may have an optional processor cooling fan 512 that draws cold air into the front of the processor. As air flows through a processor 500, it absorbs heat generated by the processor and thereby cooling the processor. A processor may have a processor cooling fan that expels heated air from the rear of the processor 500. Some processors may have both an intake cooling fan and an exhaust cooling fan while other processors may not have any such cooling or ventilation fans.

Transportable datacenter 100 includes a relatively large number of processor bays, allowing for many processors to be installed within it. Transportable datacenter may be particularly suitable for tasks that require substantial parallel processing by many processors, such as mining cryptocurrencies, identifying large prime numbers, operating blockchain based information systems and many other such tasks.

Figure 6:
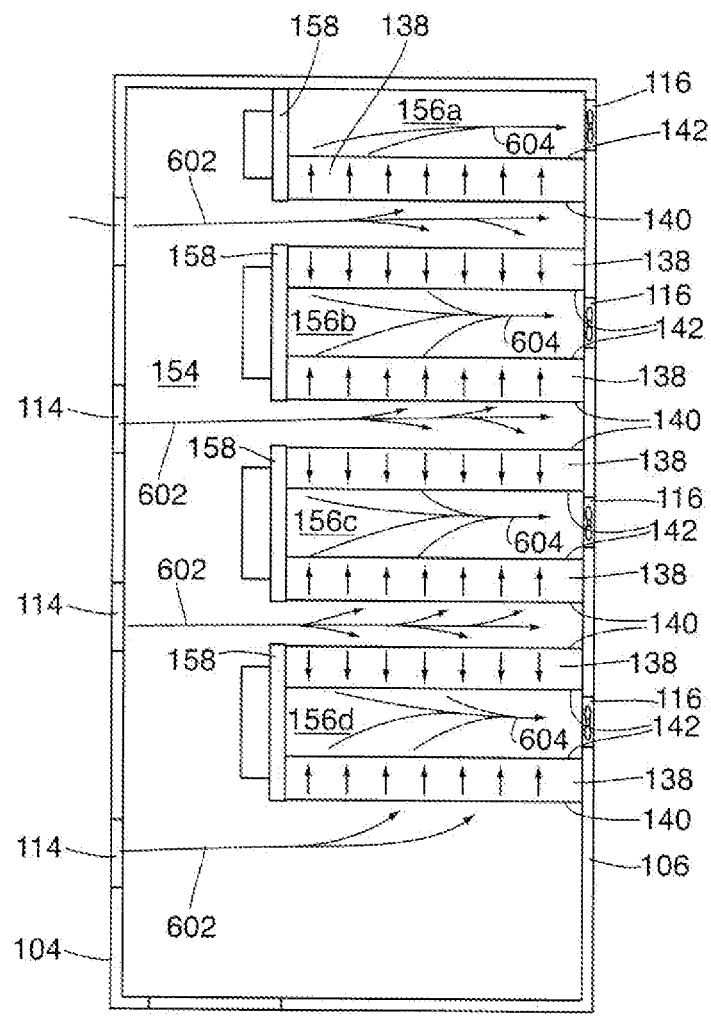
FIG. 6 illustrates airflows in the transportable datacenter of FIG. 1.

Reference is next made to FIG. 6, which illustrates air flows created by the ventilation system through transportable datacenter 100. Each rack extends from a hot air plenum barrier 158 to the exhaust sidewall 106 of the housing 102. The front face 140 of each processor bay 138 opens into a cold air plenum 154 (which may also be referred to as a cold air zone). The rear face 142 of each processor bay 138 opens into a hot air plenum 156 (which may also be referred to as a hot air zone). The airflows in transportable datacenter 100 include intake airflows 602 and exhaust airflows 604. Intake airflows 602 extend from the intake air openings 114 on the intake side of housing 102 to the front of the processor bays 138 through the cold air plenum 154.

Cold intake air then flows through the processor bays 138, where it cools processors 500 installed in the processor bays 138 and which warms the air. The warmed air exits from the rear of the processor bays 138 into the hot air plenum 156. The warmed air is then exhausted through the exhaust side of the housing as shown by exhaust airflows 604.

In transportable datacenter 100, the hot air plenums 156 are substantially fluidically isolated from the cold air plenum 154 so that warmed air exiting the rear face 142 of the processor bays 138 does not substantially mix with cold air that has not yet reached the front face 140 of the processor bays 138 when the ventilation system is in operation. The ventilation system progressively draws air from the environment of the transportable datacenter 100, through the air intake openings 114, the cold air plenum 154, the processor bays 138, the hot air plenums 156 and then through the exhaust air openings 116 back to the environment of the transportable datacenter.

For example, hot air plenum 156*a* is enclosed or contained within a volume or space defined by hot air plenum barrier 158*a*, end wall 110, side wall 106 and the rear faces 142 of the processor bays 138 on a first rack 134*a*. Rack 134*a* may extend from the floor 118 to the ceiling 120 of the housing, in which case, the floor and ceiling 120 also define the enclosed volume of hot air plenum 156*a*.

Hot air plenum 156*b* is enclosed between the rear faces of racks 134*b* and 134*c*, a hot air plenum barrier 158*b* and side wall 106. Racks 134*b* and 134*c* may not extend to the ceiling 120 of the housing 102. Instead a hot air plenum cover 160*b* (shown cut away in FIG. 3A) is installed between the tops of racks 134*b* and 134*c*. The hot air plenum cover 160*b* also defines the enclosed volume of hot air plenum 156*b*. The hot air plenum may be enclosed in other manners, for example, if a rack does not extend to the ceiling 120, a hot air plenum barrier may be installed from the top of the rack to the ceiling 120. This may allow a hot zone with a larger volume, and possibly larger exhaust fans with greater air moving capacity to be used, provide greater air movement through the transportable datacenter and greater cooling for the processors 500.

Similarly the other hot air plenums 156c and 156d are enclosed between respective racks 134, a hot air plenum barrier 158 and sidewall 106, as described above.

In transportable datacenter 100, intake airflows 602 and exhaust airflows 604 are generated by exhaust fans 128, which draw relatively cold air from the environment through the intake air openings 114, along intake airflows 602, through processor bays 138, exhaust airflows 604 and out of the transportable datacenter 100 through exhaust air openings 116. Some or all of the processors 500 installed in processor bays 138 may include processor intake fans 512 or processor exhaust fans 514 or both. Processor fans 512 and 514 move cold air from the cold air plenum 154 to the hot air plenum 156 through the corresponding processors 500. When provided, the processor fans also contribute to generation of the intake airflows 602 and exhaust airflows 604. As noted above, air intake fans may be installed in some or all of the air intake openings 114 to blow relatively cold air from the environment of transportable datacenter 100 into the cold air plenum 154. In various embodiments, a transportable datacenter 100 may include any combination of cold air intake fans, processor fans on processors 500, and hot air exhaust fans 128. In any particular embodiment, at least one type of fan will be provided.

Figure 7A:
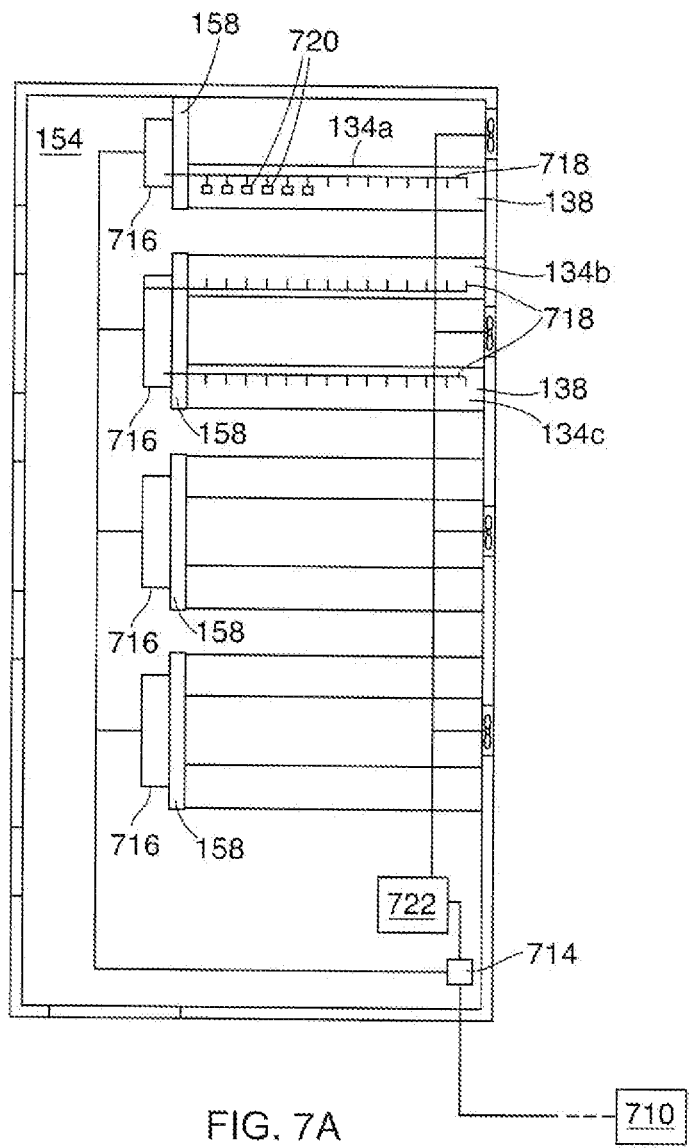
FIG. 7A illustrates an electric power system in the transportable datacenter of FIG. 1.

Referring to FIG. 7A, transportable datacenter 100 has an electric power terminal 714, which may include a one or three phase interface for receiving an external power supply from an external power source. Power terminal 714 is coupled to a series of power supplies 716 mounted on the hot air plenum barriers 158 facing the cold air plenum 154. From each power supply 716, a cable assembly 718 provides a bay power signal to each processor bay 138 in the adjacent racks 134. The cable assembly 718 may include power cables and power cable harnesses that connect the power supply to a power plug 720 positioned at each processor bay. The bay power signal provided at each processor bay has a voltage suitable for the processor to be installed at that bay, with sufficient power to provide the processor's power requirements.

In some embodiments, the power supply may simply couple the external power source to the power plug 720 positioned at each processor bay. For example, this may be done if the external power supply provides power at a voltage suitable for directly powering the processors.

In other embodiments, the power supply may include one or more transformers to transform the external power supply to bay power supplies having one or more voltages suitable to power the processors. The appropriate bay power signal for each processor bay is provided at each respective power plug 720 at each processor bay 138 through the cable assembly 718.

In various embodiments, there may be any number of power supplies 716. For example, some transportable datacenters may include a single power supply 716 that provides power to each processor bay, while others may include a plurality of power supplies located proximate different groups or racks of processor bays as shown in FIG. 7A.

In the present example embodiment, each power supply includes a power supply panel that includes switches to selectively enable and disable the bay power supply at each processor bay. Each switch may be part of a circuit breaker that can automatically disable a bay power supply if an over-current, over-temperature or other trigger condition occurs. In some embodiments, the power supply may consist of a cable assembly that couples the external power supply to a power plug at each processor bay without any intervening switches, transformers or other elements.

Electric power from the external power supply is also used to power any intake fans (if provided in any particular embodiment) and exhaust fans 128 (if provided in any particular embodiment) built into the transportable datacenter 100. Each intake fan and exhaust fan will typically be powered from a fan power supply 722 that provides an appropriate power signal for each intake fan or exhaust fan. In some embodiments, the intake fans and exhaust fans may simply operate at full capacity when they are powered up.

In other embodiments, some or all of the intake fans or exhaust fans may include an onboard speed controller that adjusts the speed of the respective fan in response to one or more measured air temperatures. For example, each fan may include or be connected to temperature sensors that measure the air temperature in the environment of the transportable datacenter, in one or more areas of the cold air plenum, or within one or more areas of one or more of the hot air plenums, or a combination of those locations. The fan may adjust its speed in response to the measured temperatures. For example, an exhaust fan will typically operate at a higher speed in response to a higher air temperature in the corresponding hot air plenum. An intake fan may operate at a higher temperature in response to a higher air temperature in any of the environment of the transportable datacenter, the cold air plenum or a hot air plenum. In any particular embodiment, each fan may be configured to adjust its speed in response to various temperature conditions, or combinations of temperature conditions in order to maintain a desired temperature or temperature range within one or more areas of the transportable datacenter.

In some embodiments, some or all of the intake fans or exhaust fans may operate under the control of a central fan controller. The central fan controller may be coupled to temperature sensors that sense air temperatures in the environment of the transportable datacenter, in one or more areas of the cold air plenum, or in one or more areas of one or more of the hot air plenums, or in a combination of those locations. The fan controller may vary the speed of each intake fan or exhaust fan to maintain a desired temperature or range of temperatures within one or more areas of the transportable datacenter.

Controlling the speed of some or all of the intake fans or exhaust fans provided in any particular embodiment may reduce the power consumption of transportable datacenter. For example, when a transportable datacenter operates in a colder environment, less air flow may be required through the transportable datacenter to maintain desired temperatures. Other factors affecting the cooling requirements of a transportable datacenter may include the number of processors installed in the transportable datacenter, the layout of racks and processor bays, heat generated by the processors (which may vary from processor to processor, or from rack to rack, or both), or the rate of change of temperatures in the environment or interior of the transportable datacenter.

Figure 7B:
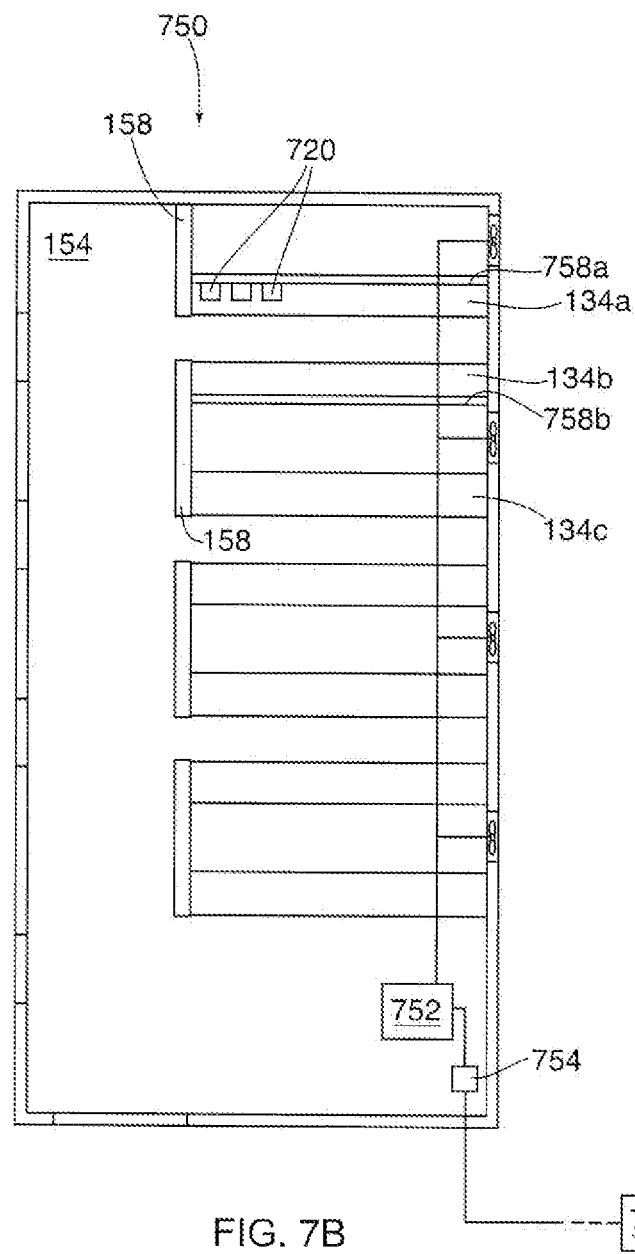
FIG. 7B illustrates an electric power system in the transportable datacenter of FIG. 1.

Reference is next made to FIG. 7B, where an alternate embodiment of an electric power system for transportable datacenter 100 is shown. The electric power terminal 754, includes an interface for receiving an external power supply from an external power source. Power terminal 754 is coupled to each of the racks 134. At each rack 134, a bus bar 758 provides a bay power signal to each processor bay 138 in racks 134. The bay power signal may be provided by a plug attached to the bus bar 758, the plug connecting to a processor disposed in the processor bay 138. The bus bars 758 may be integrated with the rack 134, and may have an integrated bus connection that may couple with the bus bar 758 with the plug via a terminal, a clip, a crimping connection, or another electrical connector. The bay power signal provided at each processor bay has a voltage suitable for the processor to be installed at that bay, with sufficient power to provide the processor's power requirements. Optionally, there is a relay system (not shown) provided allowing a user to disable a rack, a shelf in a rack, or the transportable datacenter. The electric power system having bus bars 758 may enable easy processor installation.

Figure 8:
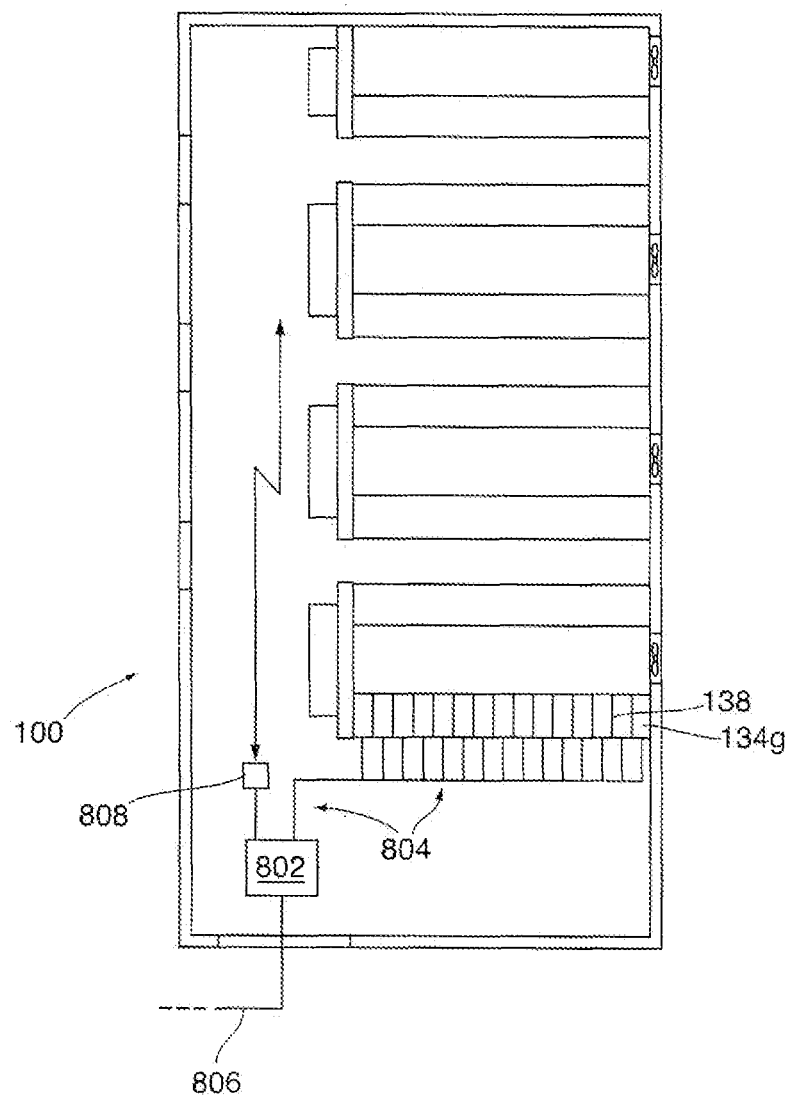
FIG. 8 illustrates a data network in the transportable datacenter of FIG. 1.

Reference is next made to FIG. 8, which also illustrates transportable datacenter 100. Transportable datacenter 100 includes an external communication network connection 802. Typically, the external network connection 802 allows processors and other computing devices in transportable datacenter 100 to communicate with external computing devices using an external data communication network 806 such as the Internet or another communication network.

External network connection 802 is coupled to a data network 804 within transportable datacenter 100. The data network 804 may include various network devices such as routers, switches and cables to provide network connectivity at some or all of the processor bays. The data network 804 may include wireless communication devices 808 that facilitate wireless communication between network devices and between processors and the data network. Any particular processor bay may be provided with either wired or wireless network connectivity or both, allowing a processor in the processor bay to communicate with other devices (including other processors) coupled to the data network 804, and to communicate with external computing devices.

A transportable datacenter may be designed for transport in various ways. Transportable datacenter 100 has a housing 102 which is a transportable shipping container. The shipping container is adapted to be transported by truck, rail or ship from a location at which it is manufactured to a location at which the transportable datacenter will be put into operation. For example, the shipping container may include twistlocks 162 (FIGS. 1, 2) or other appropriate mounts to allow the container to be mounted on a truck, trailer or rail car or other transport platform. In other embodiments, a transportable datacenter may be built on a frame or base that has or can be equipped with wheels for transportation. For example, a transportable datacenter may be built on a trailer that can be hitched to a truck for transport. In some embodiments, the mounts used to mount a transportable datacenter for transportation may also be used to stack multiple transportable datacenters.

Figure 9:
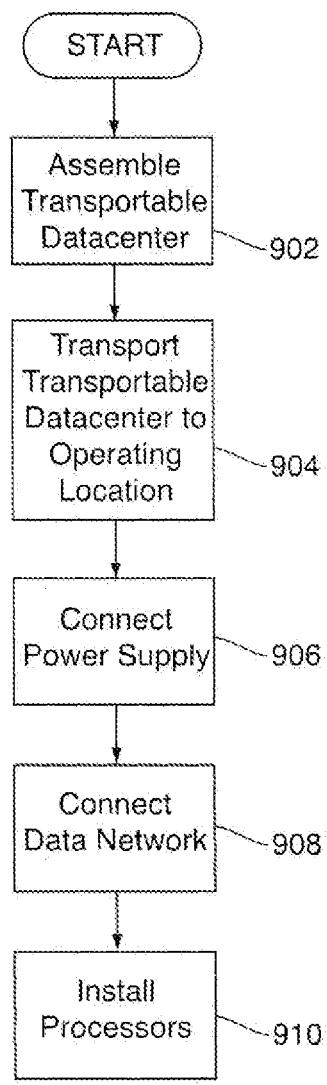
FIG. 9 shows a method of preparing a transportable datacenter for use.

Referring to FIG. 9, a transportable datacenter may be installed by method 900:
- At 902, manufacturing or assembling the transportable datacenter at an assembly facility manufacturing facility is shown. Manufacturing or assembling the transportable datacenter includes:
    - Providing a housing having air intake openings and air exhaust openings.
    - Installing a plurality of racks in the transportable datacenter, with each rack including a plurality of processor bays.
    - Substantially fluidically isolating the cold air plenum at the front face of the processor bays from the hot air plenum at the rear face of the processor bays.
    - Installing a cooling system for progressively drawing air from an environment of the transportable datacenter through the air intake openings, the cold air plenum, the processor bays, the hot air plenums and through the air exhaust openings back to the environment.
- At 904, the assembled transportable container is transported to an operating location.
- At 906, the transportable datacenter's external power supply is connected to an external power source.
- At 908, the transportable datacenter's external communication network is connected to an external data communication network.
- At 910, installing processors in the processor bays of the transportable datacenter, by positioning each processor in a processor bay, and connecting each processor to a respective power plug and connecting the processor to the transportable datacenter's data network.

Once the transportable datacenter has been installed, the transportable datacenter may be initiated in operation by activating the intake fans (if provided), exhaust fans (if provided), and the processors. When the processors are activated, any processor intake cooling fans and processor exhaust cooling fans will be activated under the control of a fan controller built into the respective processor.

In some situations, the transportable datacenter may be substantially assembled prior to transport to an operating location, where assembly of the transportable datacenter may be completed. For example, the transportable datacenter may be shipped with protective covers over the intake openings 114 and the exhaust openings 116. Intake filters and exhaust fans 128 may be installed at the operating location. Similarly, the transportable datacenter may be shipped without other elements installed in their final position, and those elements may be installed prior to putting the transportable datacenter into operation.

Figure 10:
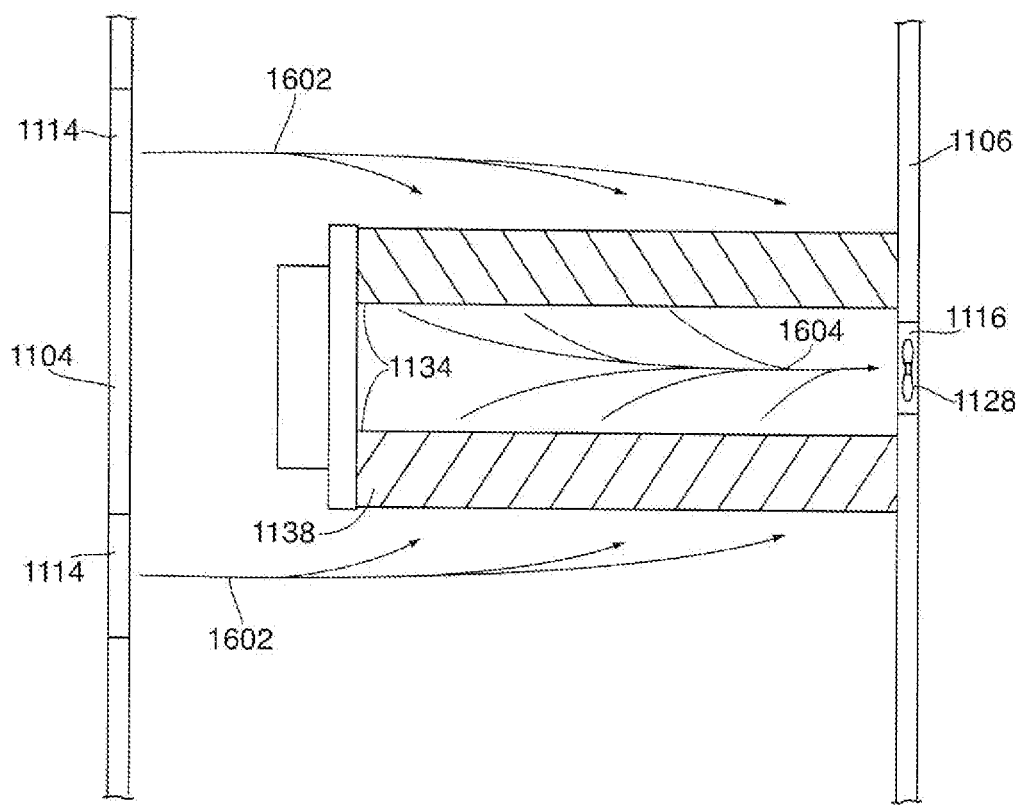
FIG. 10 illustrates an alternative rack.

Reference is next made to FIG. 10, which illustrates a rack 1134. Elements of rack 1134 that correspond to rack 134 are identified by corresponding reference numerals. In rack 134, the processor bays are arranged generally at a right angle to the long direction of the rack. In rack 1034, the processor bays 1138 are arranged at an oblique angle to provide a straighter path for air flow between the intake airflows 1602 and the exhaust air flows 1604, potentially reducing turbulence in the air flow in the transportable datacenter, and potentially increasing the cooling effect of the air flows. Rack 1034 may be used for some or all of the racks in a transportable datacenter.

Figure 11:
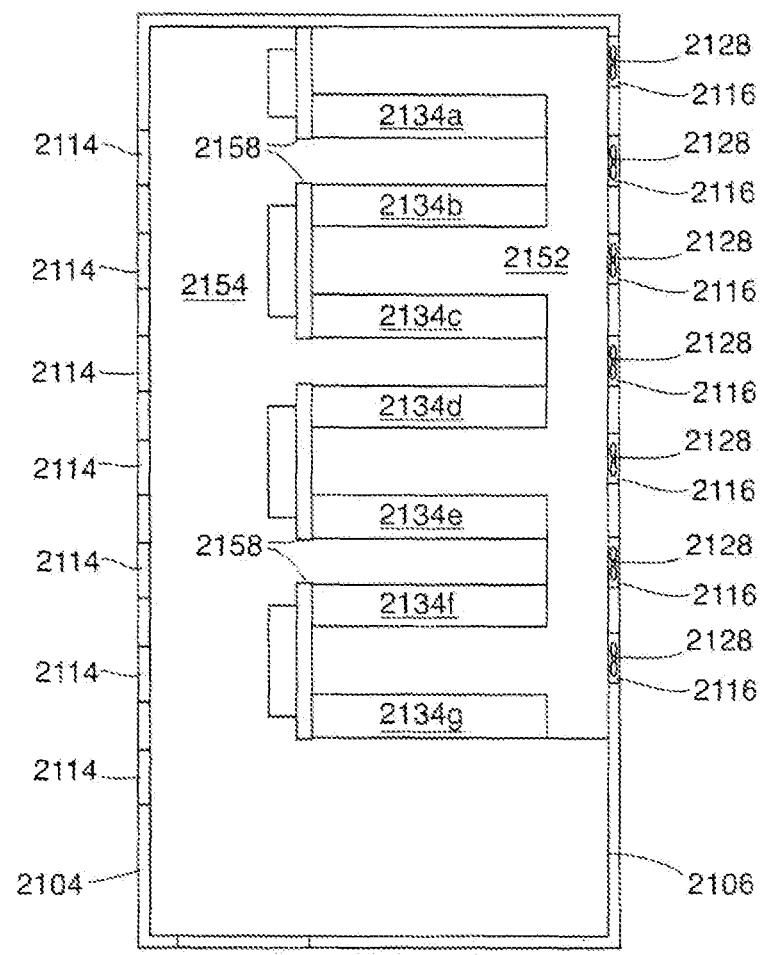
FIG. 11 illustrates another transportable datacenter.

Reference is next made to FIG. 11, which illustrates another transportable datacenter 2100. Elements of transportable datacenter 2100 that correspond to transportable datacenter 100 are identified by corresponding reference numerals. In transportable datacenter 2100, the racks 2134 extend from hot air plenum barrier 2158 towards exhaust sidewall 2106, but are spaced apart from the exhaust sidewall 2106. This provides a hot air plenum 2156 that extends along the length of exhaust sidewall 2106 and allows additional exhaust fans to be installed along a greater portion of the length of sidewall 2106, potentially providing greater airflow and cooling through the transportable datacenter.

Figure 12:
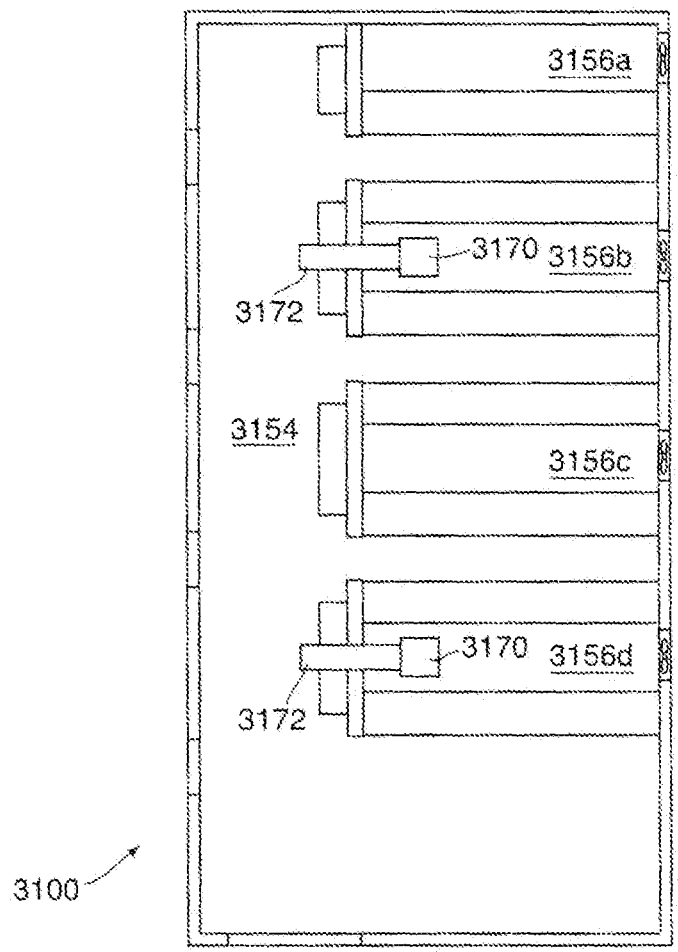
FIG. 12 illustrates another transportable datacenter.

Reference is next made to FIG. 12, which illustrates another transportable datacenter 3100. Elements of transportable datacenter 3100 that correspond to transportable datacenters 100 and 2100 are identified by corresponding reference numerals. In transportable datacenter 3100, the ventilation system includes a plurality of hot air mixing fans 3170 that are operable, under the control of a central fan controller, to draw air from one or more hot air plenums 3156 into to the cold air plenum 3154 through ducting 3172. The central fan controller may activate and control the speed of the hot air mixing fans 3170 in response to temperature measurements in the environment, in the cold air plenum 3154, or at one or more processors, or a combination of these and other locations. In some environments, cold air drawn from the environment of a transportable datacenter into the cold air plenum 3154 may be sufficiently cold to negatively impact the operation of the processors or other elements of the transportable datacenter. In those situations, it may be desirable to heat the air in the cold air plenum 3154 by mixing hot air from one or more hot air plenums 3156 into the cold air plenum. In this example, hot air from two hot air plenums 3156b and 3156d is mixed with cold air in the cold air plenum 3154. In other embodiments, a greater or smaller number of hot air mixing fans 3170 may be provided to mix hot air from any number of hot air plenums into the cold air plenum 3154.

Figure 13A:
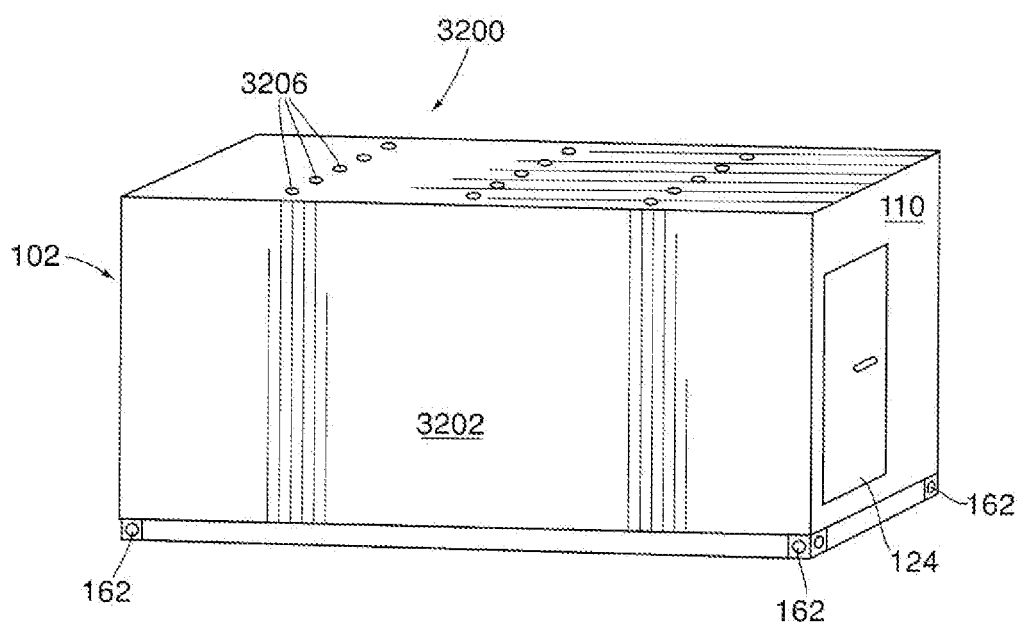
FIG. 13A illustrates a perspective view of another transportable datacenter.
Figure 13B:
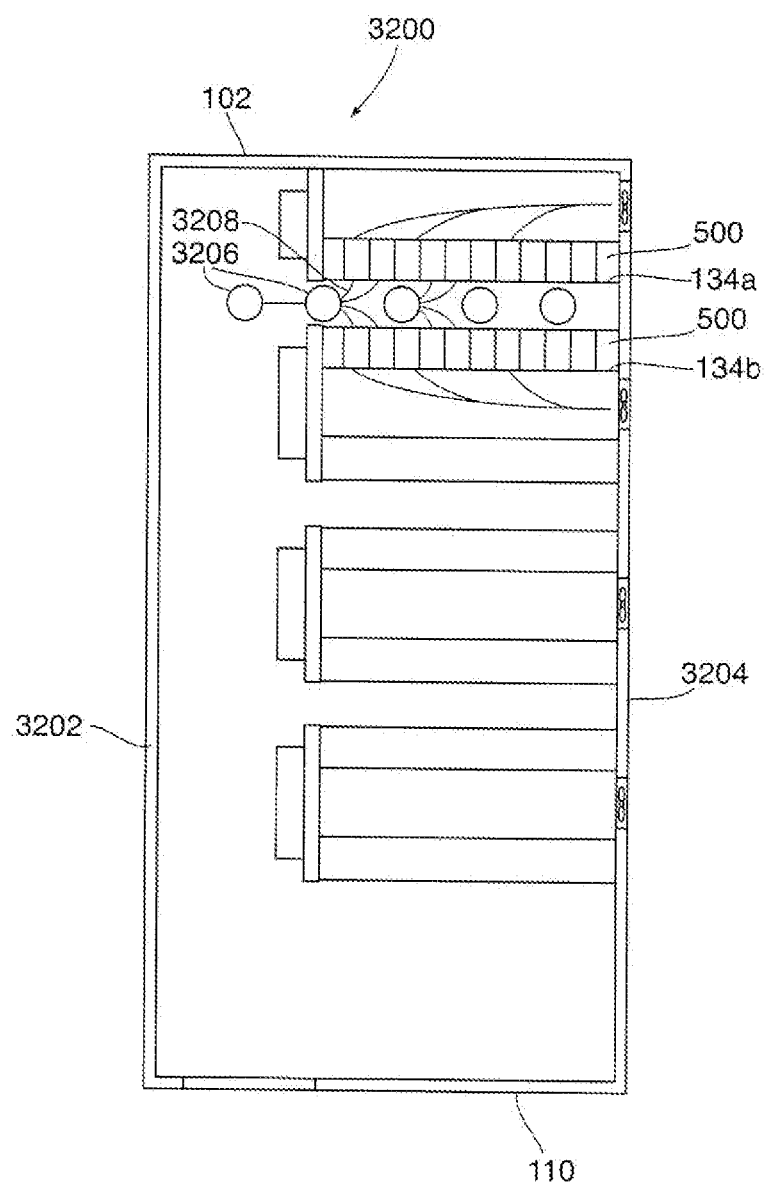
FIG. 13B illustrates a cutaway top view of the transportable datacenter from FIG. 13A.

Reference is next made to FIGS. 13A and 13B which illustrate another embodiment of a transportable datacenter 3200. The transportable datacenter 3200 has intake ports 3206 on the roof of the transportable datacenter for providing ventilation of cool air from the environment into the cold plenum. Each of the intake openings 3206 will typically have a filter or other protective element installed in the intake opening to reduce the flow of dirt, dust and other particulate matter and contaminants into the transportable datacenter 3200. The air intake openings may have baffles or other physical protective elements to reduce the flow of rain and other materials into the transportable datacenter 3200. In some embodiments, some or all of the intake openings may have an air intake fan installed within them. The intake openings 3206 may be sized identically or differently from one another. The air openings provide intake air flows 3208 from the intake opening 3206 to the plurality of processor bays on the rack 134.

Figure 14:
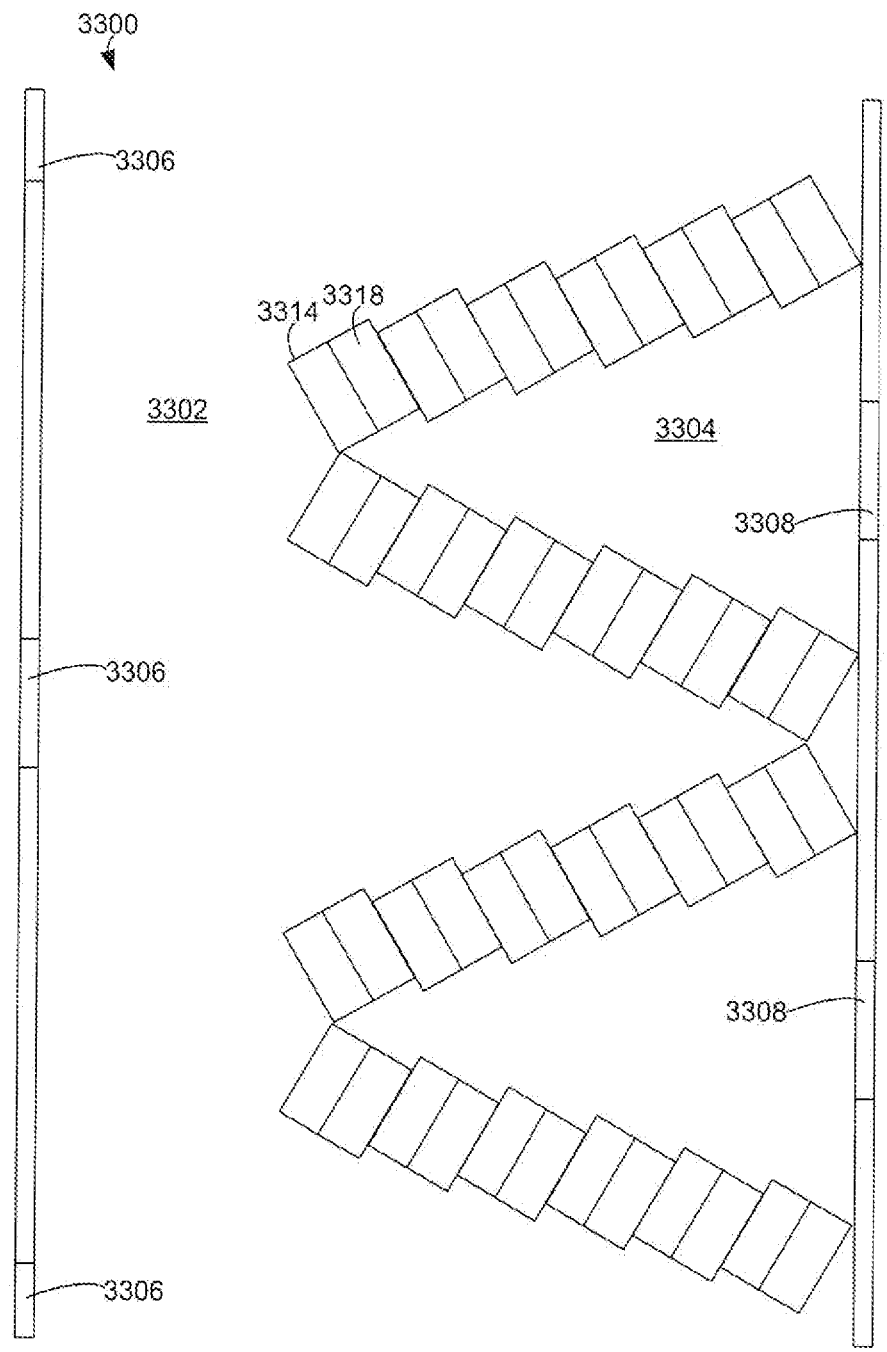
FIG. 14 is a cutaway portion view of another transportable datacenter.

Referring to FIG. 14, there is another embodiment of a transportable datacenter 3300. Elements of rack 3314 that correspond to rack 134 are identified by corresponding reference numerals. In rack 134, the processor bays are arranged generally at a right angle to the long direction of the rack. In rack 3314, the processor bays 138 are staggered in order to provide a straighter path for air flow between the intake airflows and the exhaust air flows, potentially reducing turbulence in the air flow in the transportable datacenter, and potentially increasing the cooling effect of the air flows. The two racks 3314 in a pair of racks may form a "v-shaped" configuration with an end of each rack in the pair forming an angle as shown. Rack 3314 may be used for some or all of the racks in a transportable datacenter. Intake openings 3306 are provided to allow for the intake of cooler air from the environment. Exhaust openings 3308 are provided to allow for exhaust of hot exhaust air into the environment.

Figure 15A:
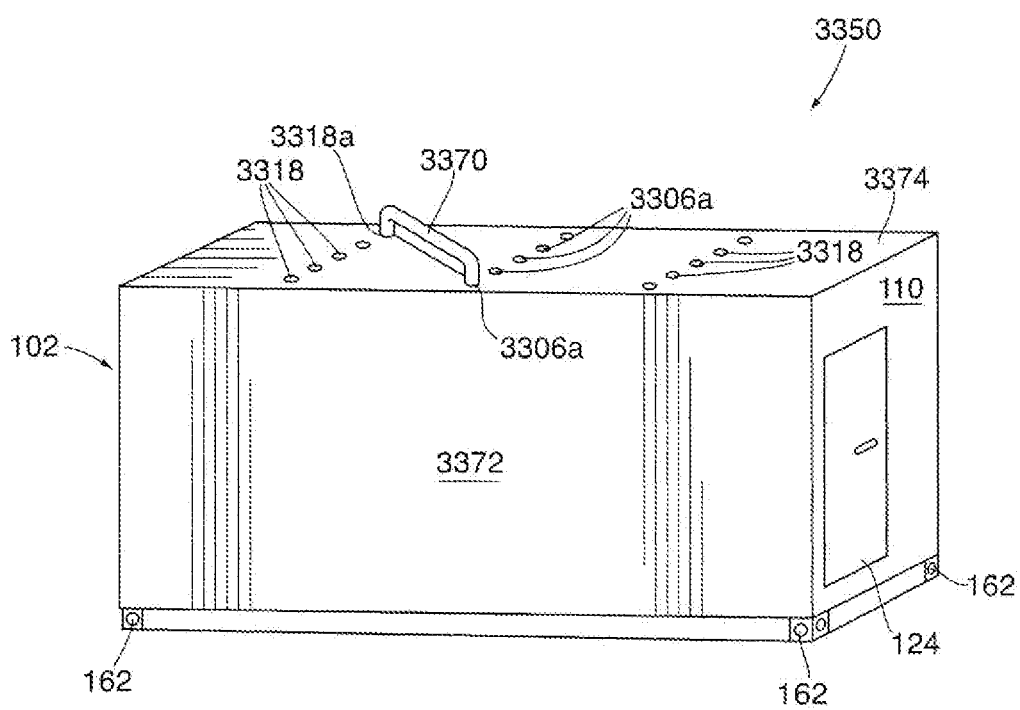
FIG. 15A illustrates a perspective view of another transportable datacenter.

Referring to FIG. 15A, there is a perspective view of another embodiment of a transportable datacenter 3350. Transportable datacenter 3350 has intake openings 3306 on the roof 3374 and exhaust openings 3318 on the roof 3374. One or more exhaust openings 3318a may be connected by ducting to an intake opening 3306a to allow hot exhaust air to recirculate from the hot plenum into the cold plenum. The recirculation of hot air may be controlled by an independent control mechanism. The ducting may be internal or external to datacenter 3350. In this embodiment, air intake occurs through the intake openings 3306 on roof 3374, but air may optionally intake through the intake openings 3306 on roof 3374 and intake openings on side wall 3372 (see FIG. 2 at 116).

It is understood that there may be a transportable datacenter with intake openings on the first sidewall (the intake sidewall), intake openings on the roof, or both intake openings of the first sidewall (the intake sidewall) and the roof. It is further understood that there may be a transportable datacenter with exhaust openings on the second sidewall (the exhaust sidewall), exhaust openings on the roof, or exhaust openings on the second sidewall (the exhaust sidewall) and exhaust openings on the roof.

Figure 15B:
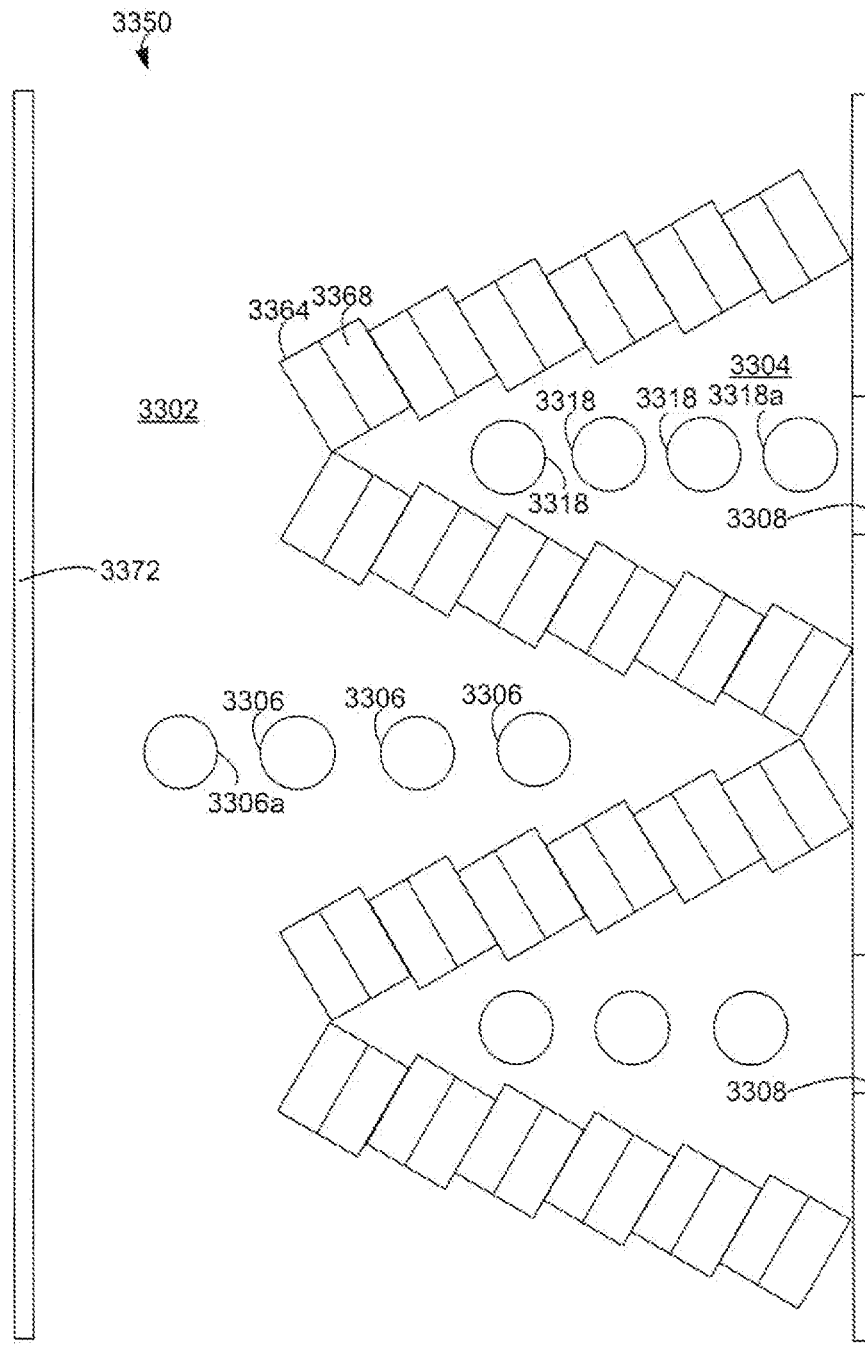
FIG. 15B is a cutaway portion view of the transportable datacenter of FIG. 15A.

Referring to FIG. 15B, there is shown a cutaway top portion view of the transportable datacenter 3350 from FIG. 15A. In transportable datacenter 3350, a plurality of exhaust ports 3318 are provided generally directed upwards. The plurality of exhaust ports 3318 may be used to exhaust into the environment upwards. The plurality of exhaust ports 3318 may have an independent control mechanism to recirculate the exhaust air flow back into the cold air plenum 3302 via ducting. This independent control mechanism may be an air flow switch or a flue. The air flow switch may switch between recirculating hot air flow from the exhaust opening to the intake opening, and exhausting the hot air flow into the environment. The recirculation may be performed to increase the intake air temperature if the ambient air temperature in the environment is below an operating threshold for the processors disposed in processor bays 3368.

Figure 15C:
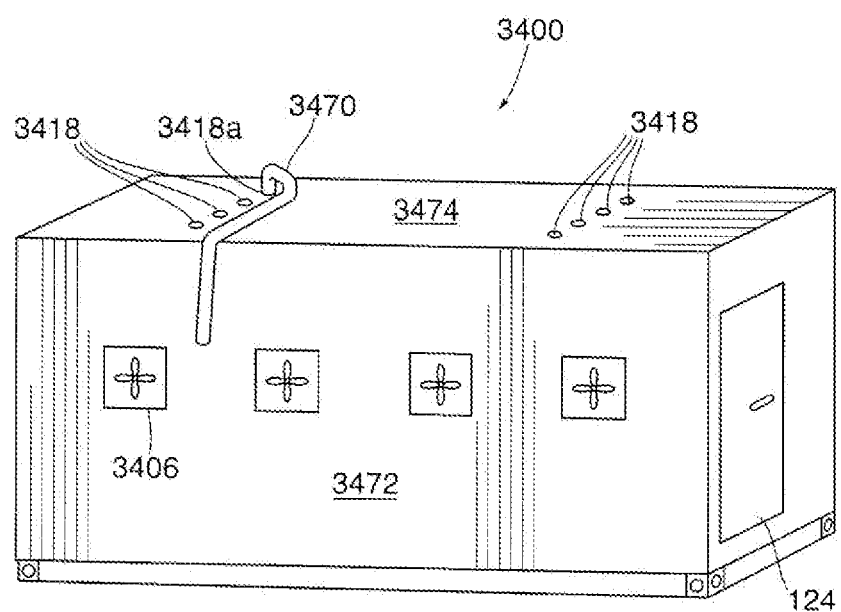
FIG. 15C illustrates a perspective view of another transportable datacenter.

Referring to FIG. 15C, there is shown a perspective view of another embodiment of a transportable datacenter 3400. Transportable datacenter 3400 has intake openings 3406 on the intake wall 3472 and exhaust openings 3418 on the roof 3474. One or more exhaust openings 3418a may have ducting 3470 to vent hot exhaust air proximate to an intake opening 3406 to allow hot exhaust air to recirculate from the hot plenum into the cold plenum. Optionally, the ducting 3470 may be connected to an intake opening 3406. The recirculation of hot air may be controlled by an independent control mechanism. The ducting may be internal or external to datacenter 3400.

Figure 15D:
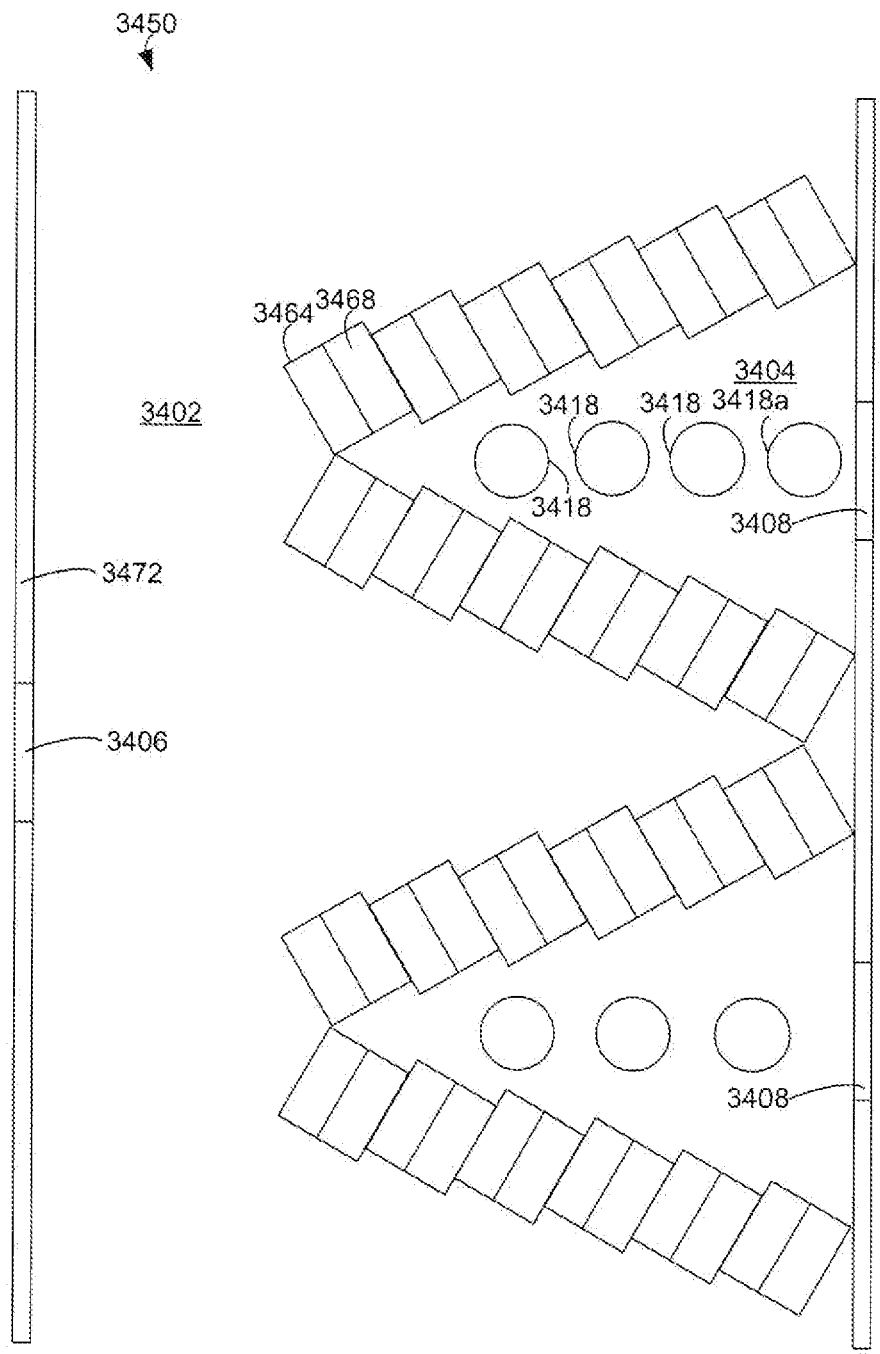
FIG. 15D is a cutaway portion view of the transportable datacenter of FIG. 15C.

Referring to FIG. 15D, there is shown a cutaway top portion view of the transportable datacenter 3400 from FIG. 15C. In transportable datacenter 3400, a plurality of exhaust ports 3418 are provided generally directed upwards. The plurality of exhaust ports 3418 may be used to exhaust into the environment upwards. The plurality of exhaust ports 3418 may have an independent control mechanism to recirculate the exhaust air flow back into the cold air plenum 3402 via ducting 3470. This independent control mechanism may be an air flow switch or a flue. The air flow switch may switch between recirculating hot air flow from the exhaust opening to the intake opening, and exhausting the hot air flow into the environment. The recirculation may be performed to increase the intake air temperature if the ambient air temperature in the environment is below an operating threshold for the processors disposed in processor bays 3468.

Figure 16A:
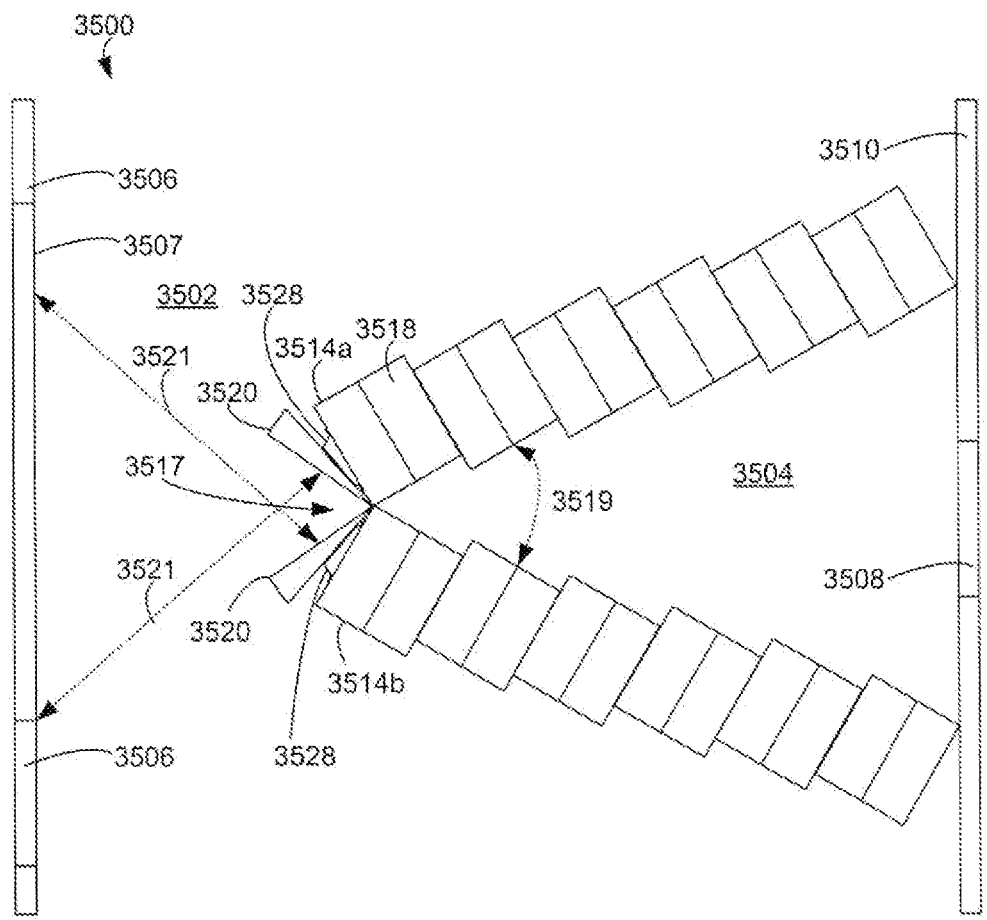
FIG. 16A is a cutaway portion view of another transportable datacenter.

Referring to FIG. 16A there is shown a cutaway portion view 3500 of another transportable datacenter showing an embodiment of the rack configuration. The transportable datacenter has two or more racks 3514, an intake sidewall 3507 having intake openings 3506, and an exhaust sidewall 3510 having exhaust openings 3508. Each of the two or more racks 3514 has a plurality of processor bays 3518 arranged generally at a right angle to the long direction of the racks 3514. In racks 3514, the processor bays 3518 are arranged at an oblique angle to provide a straighter path for air flow between the intake air flows and the exhaust air flows, and the racks 3514a and 3514b are further arranged at an angle from each other, potentially reducing turbulence in the air flow in the transportable datacenter, and potentially increasing the cooling effect of the air flows. The racks 3514 have generally the same configuration of processor bays 3518 as rack 3314 in FIG. Intake openings 3506 are provided to allow for the intake of cooler air from the environment into cold plenum 3502 for cooling of the processor bays. Exhaust openings 3308 are provided to allow for exhaust of hot exhaust air from the processor bays into the hot plenum 3504 and finally into the ambient environment.

A first rack 3514a may have a first end proximate to the exhaust sidewall 3510, and a second end proximate to the intake sidewall 3507. A second rack 3514b may have a first end proximate to the exhaust sidewall 3510, and a second end proximate to the intake sidewall 3507. The second end of the first rack 3514a and the second end of the second rack 3514b are arranged to form angle 3519, and generally define a generally triangular hot plenum 3504. The first rack 3514a and the second rack 3514b may have a generally triangular space 3517 in the cold plenum 3502 defined where they meet, opposite the hot plenum 3504.

Each of racks 3514 are further configured with an integrated power distribution system 3520. The integrated power distribution system 3520 may be attached directly to racks 3514, or may be attached using one or more mounting brackets 3528 (see FIGS. 16D, 16E, and 16F for more detail). The integrated power distribution system 3520 may be shaped to fit the triangular space 3517 formed by the angle of two racks 3514. The integrated power distribution system 3520 may be a triangular prism as shown, or it may be another shape.

The integrated power distribution system 3520 may be shaped to provide adequate clearance 3521 between the integrated power distribution system 3520 and the intake sidewall 3507, such that an operator has access to the power distribution system 3520 within the confines of the transportable container. The clearance 3521 may be a particular distance based on a regulatory requirement such as an electrical regulatory requirement. In one example, the electrical regulatory requirement may state a minimum clearance from a power distribution panel of at least 36 inches.

Figure 18A:
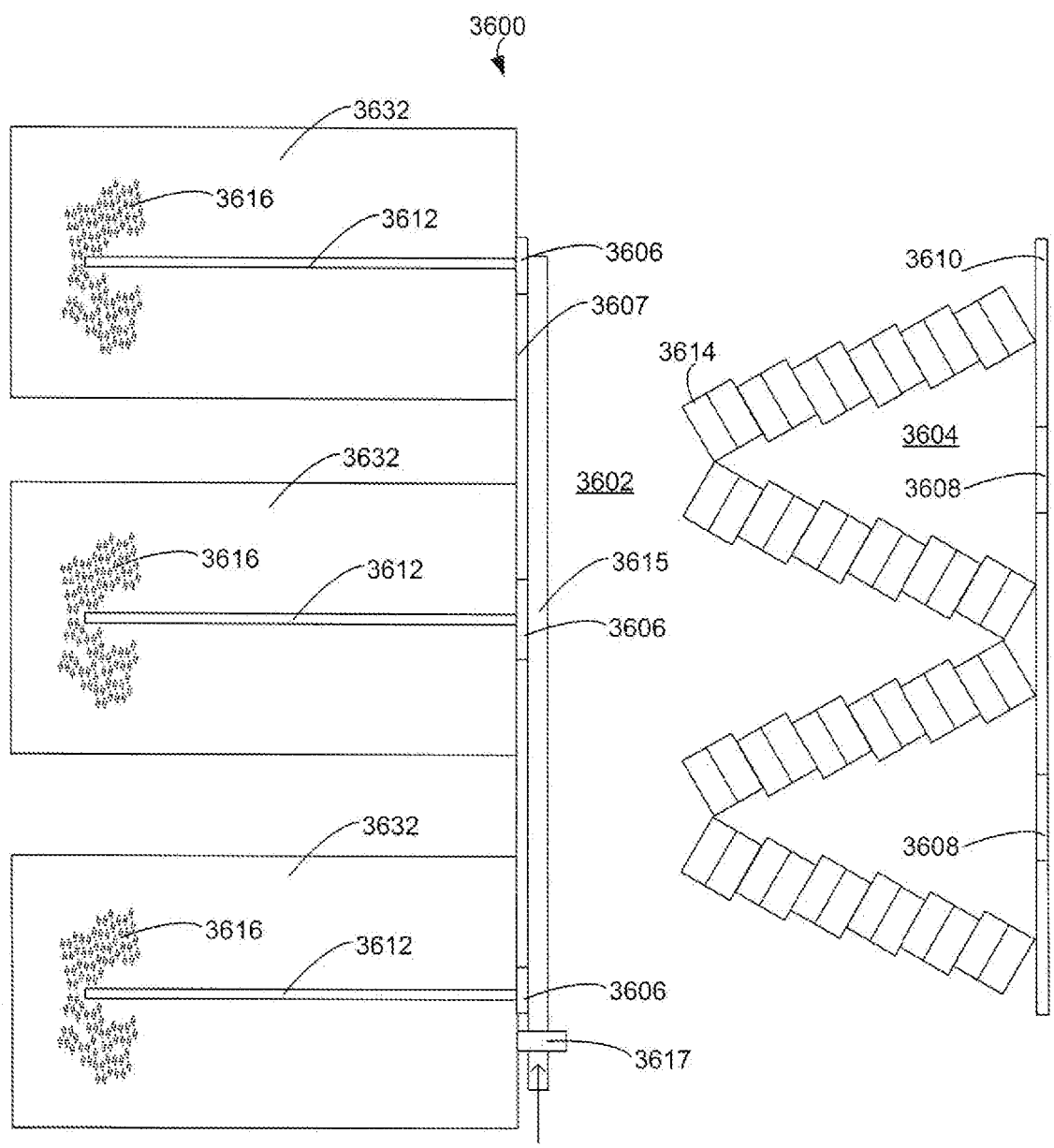
FIG. 18A is a cutaway portion view of another transportable datacenter having an evaporative cooling system.
Figure 18B:
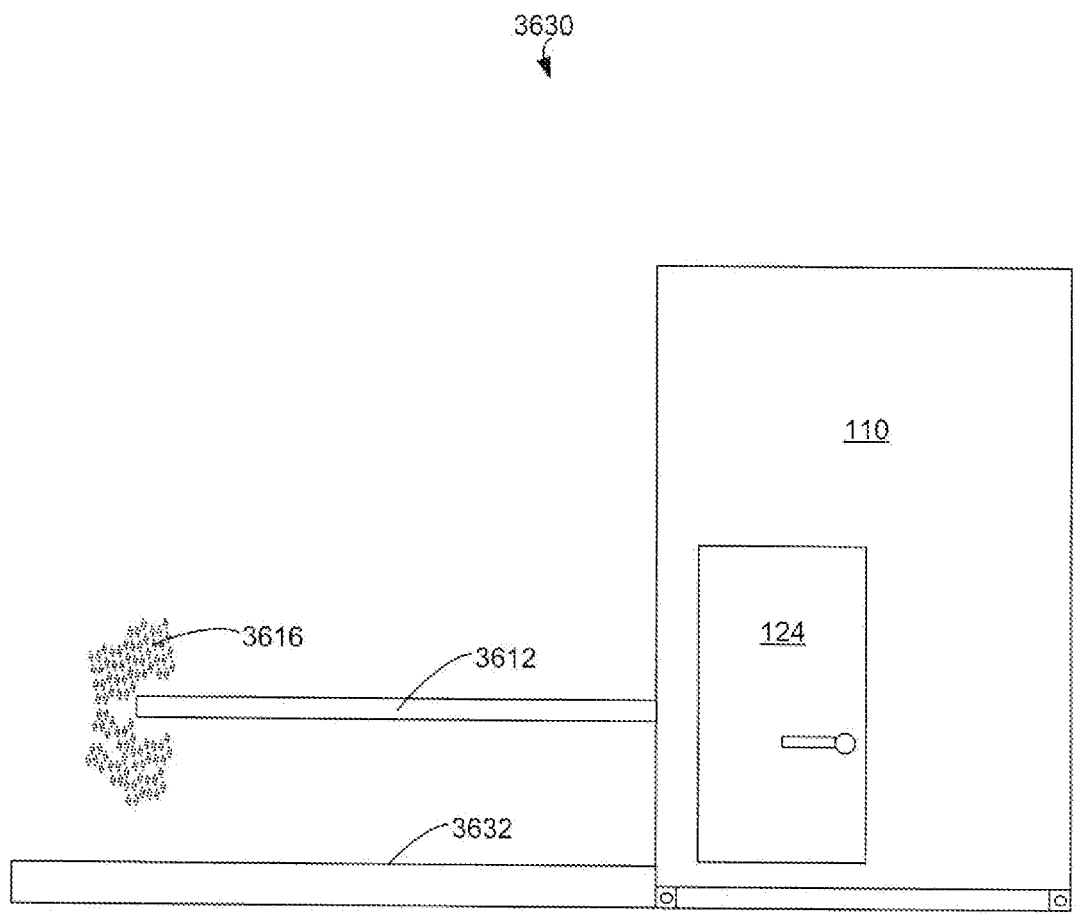
FIG. 18B is a side view of the transportable datacenter of FIG. 18A.

The integrated power distribution system 3520 provides processor power circuits to supply power to the processor bays 3518 (as shown in FIGS. 18A-18B) from one or more main circuits. Each of the processor power circuits may include processor circuit breakers for each of the processor bays 3518 in the rack 3514. Each of the one or more main circuits may include main circuit breakers.

Figure 16B:
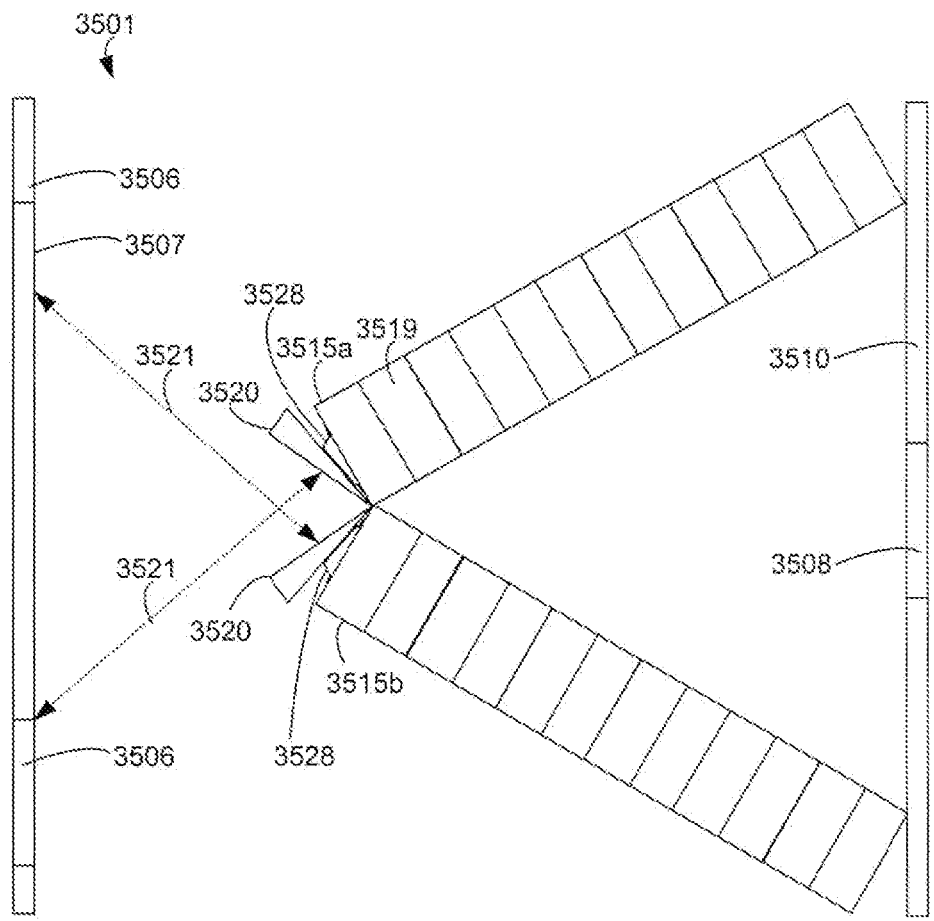
FIG. 16B is a cutaway portion view of another transportable datacenter.

Referring to FIG. 16B, there is shown a cutaway portion view 3501 of another transportable datacenter having another embodiment of racks 3515. The transportable datacenter has two or more racks 3515, an intake sidewall 3507 having intake openings 3506, and an exhaust sidewall 3510 having exhaust openings 3508. The processor bays 3519 are arranged generally at a right angle to the long direction of the racks 3515. Each processor bay in rack 3519a is generally parallel with the other processor bays in the rack. The two racks 3515a and 3515b are further arranged at an angle from each other, potentially reducing turbulence in the air flow in the transportable datacenter, and potentially increasing the cooling effect of the air flows. Intake openings 3506 are provided to allow for the intake of cooler air from the environment into cold plenum 3502. Exhaust openings 3308 are provided to allow for exhaust of hot exhaust air from the hot plenum 3504 into the environment.

It is understood that the integrated power distribution panel 3520 may be used on the rack configuration in the embodiment of the transportable datacenter shown in FIG. 16A, the embodiment of the transportable datacenter shown in FIG. 16B, the rack configuration in the embodiment of the transportable datacenter in FIG. 3A, the rack configuration in the embodiment of the transportable datacenter in FIG. 10, or another rack configuration inside a transportable container.

In FIGS. 16A and 16B, it is understood that the integrated power distribution panel 3520, or the pair of integrated power distribution panels 3520, may substantially isolate the cold plenum 3502 from the hot plenum 3504 in their attachment to the racks 3514, and may form a plenum barrier as described above. Optionally, the pair of integrated power distribution panels 3520 may be attached at one end in order to provide the plenum barrier.

Figure 16C:
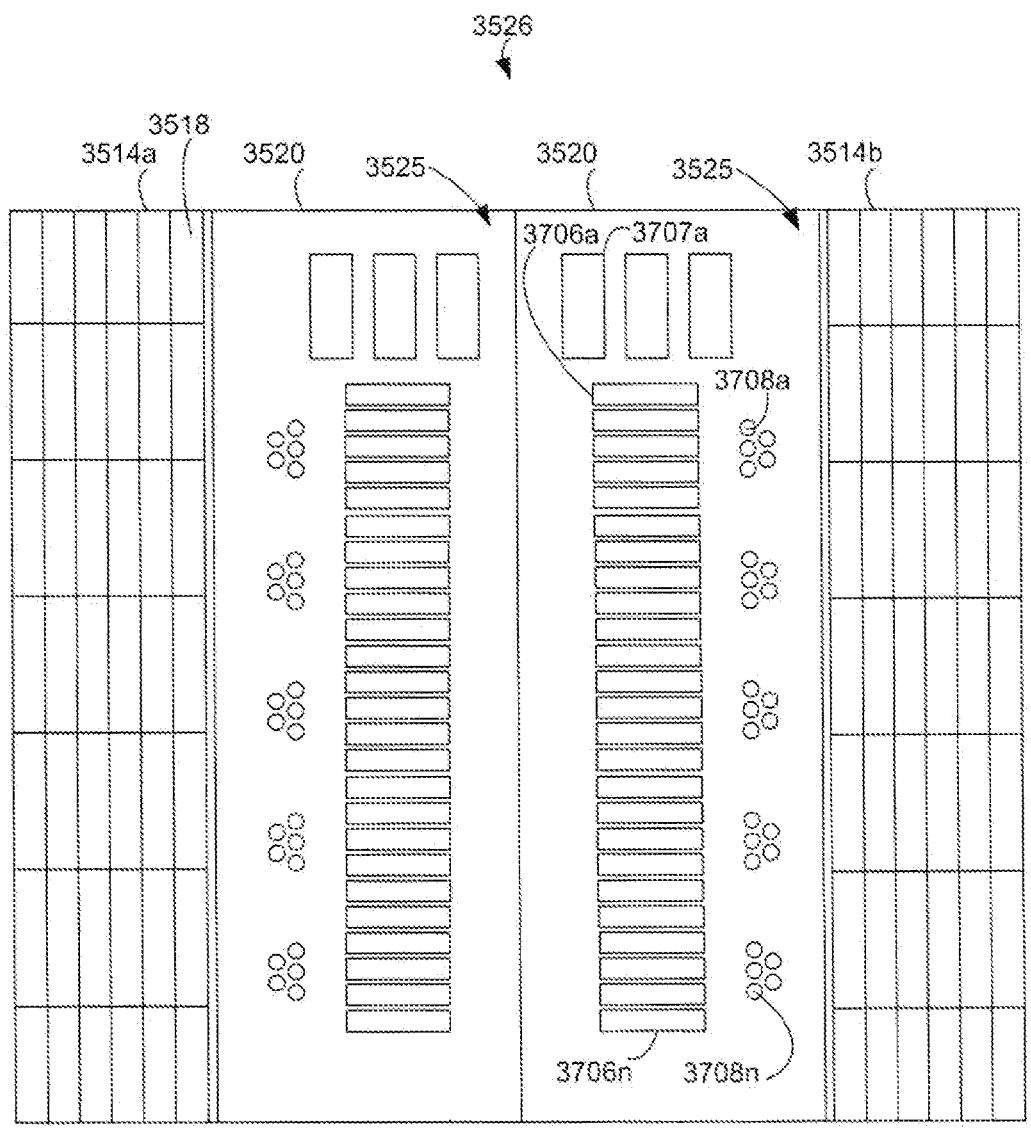
FIG. 16C is a front view of an integrated power distribution system of the transportable datacenter of FIG. 16A.

Referring next to FIG. 16C, there is shown a front view 3526 of two racks of the transportable datacenter of FIG. 16A and FIG. 16B. In this embodiment, there is shown an integrated power distribution system 3525 for each of the two racks 3514a and 3514b. As shown in FIG. 16C, the processor circuits of the two integrated power distribution systems 3525 are not connected. The integrated power distribution system 3525 includes an integrated power distribution panel 3520, one or more main circuit breakers 3707, a plurality of processor circuit breakers 3706, one or more main circuit access openings (not shown), and a plurality of processor circuit access openings 3708.

Each integrated power distribution panel 3520 is attached to the second end of the racks 3514. The panel 3520 may be a triangular prism, a rectangular cuboid, or another shape. The panel 3520 may be made from any suitable material, including aluminum, steel, or plastic.

The one or more main circuit breakers 3707 and the plurality of processor circuit breakers 3706 may be an electrical circuit breaker as is known. In one embodiment, the one or main circuit breakers 3707 and the plurality of processor circuit breakers 3706 may be Deutsches Institut fur Normung (DIN) Rail Circuit Breakers, such as those offered by NOARK®. In one embodiment, the main circuit breakers 3707 may be configured to interrupt the positive terminals of several individual single-phase electrical circuits. In an alternate embodiment, the main circuit breakers 3706 may be configured to electrically isolate individual phases of a three-phase electrical circuit. The one or more main circuit breakers 3707, and the plurality of processor circuit breakers 3706 may be attached to the front wall of the panel 3520. In an alternate embodiment, the one or main circuit breakers 3707, and the plurality of processor circuit breakers 3706 may be attached to the rear wall of the panel 3520.

The one or more main circuit access openings (not shown) may be an opening in the panel 3520 to allow for cabling or wiring to pass through. In an alternate embodiment, the one or more main circuit access openings may be connectors attached through the panel for connection to the one or more main circuits.

The plurality of processor circuit access openings 3708, may be an opening in the panel 3520 to allow for cabling or wiring to pass through. In an alternate embodiment, the one or more processor circuit access openings may be connectors attached through the panel for connection to the plurality of processor circuits.

Figure 16D:
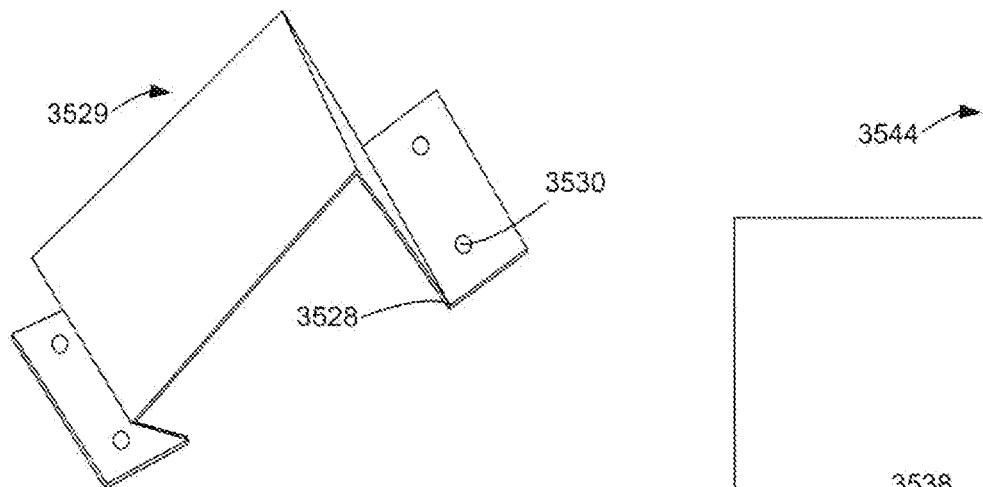
FIG. 16D is a perspective view of a mounting bracket.

Referring next to FIG. 16D, there is shown a perspective view 3529 of a mounting bracket 3528. The mounting bracket 3528 may be attached to the end of a rack, and also attached and supporting the integrated power distribution system of the transportable datacenter of FIG. 16A. The mounting bracket 3528 supports the integrated power distribution system generally spaced away from the rack, and at an angle. The mounting bracket 3528 may be made of any suitable material for supporting the integrated power distribution system, for example, a rigid material such as aluminum or steel. In one embodiment, the mounting bracket 3528 may be a single piece of material that is bent, formed, or cast. In an alternate embodiment, the mounting bracket 3528 may be formed from more than one piece, for instance, using fasteners or by welding.

The bracket 3528 may be attached to the rack using any fastener means. For example, as shown, the bracket 3528 may be bolted to the rack using through-holes 3530.

Figure 16F:
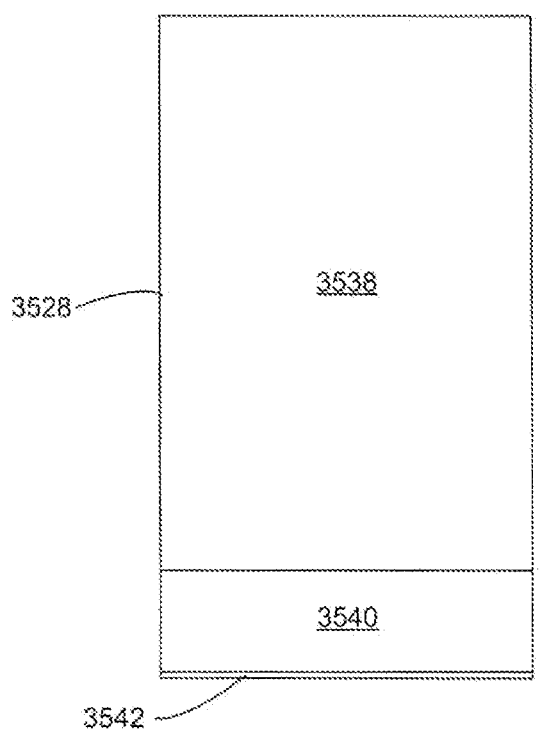
FIG. 16F is a front view of the mounting bracket in FIG. 16D.
Figure 16E:
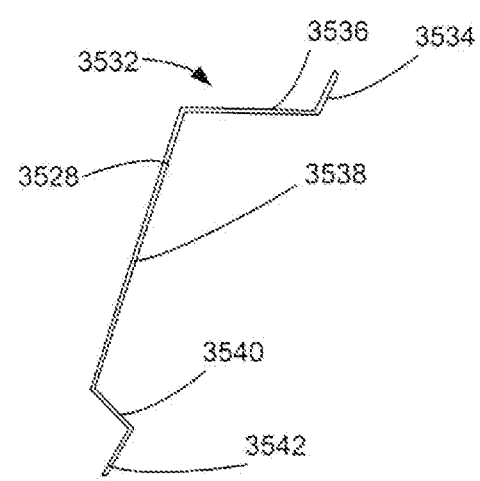
FIG. 16E is a side view of the mounting bracket in FIG. 16D.

Referring next to FIG. 16E, there is shown a side view 3532 of the mounting bracket in FIG. 16D. As shown, the mounting bracket 3528 may have a first flange 3534 for attaching the bracket to the rack, a first spacer 3536 that extends from the first flange, a standoff 3538 that extends from the first spacer 3536, a second spacer 3540 extending from the standoff 3538, and a second flange 3542 extending from the second spacer 3540. The first flange 3534 and the second flange 3542 are for attachment to the rack, and may be configured to sit generally flush with the rack. The first spacer 3536 and the second spacer 3540 are of different lengths and generally configured to secure the integrated power distribution system at an angle to the rack. The standoff 3538 is for attachment to the integrated power distribution system, using any known fastener means.

Referring next to FIG. 16F there is shown a front view 3544 of the mounting bracket in FIG. 16D. The mounting bracket 3528 shows that the second flange 3542, second spacer 3540, and standoff 3538 may be generally rectangular shaped. Similarly, the first flange 3534 and first spacer 3536 may also be generally rectangular shaped.

Figure 16G:
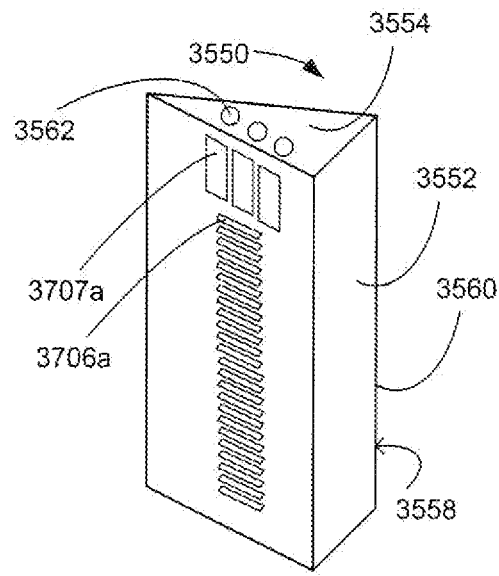
FIG. 16G is a perspective view of a power distribution panel of the transportable datacenter of FIG. 16A.

Referring next to FIG. 16G is shown a perspective view of a power distribution panel of the transportable datacenter of FIG. 16A. The power distribution system has a housing 3560 having a top surface 3554, a base surface 3552, and a rear surface 3558. In one embodiment, the housing 3560 may not have a front surface and instead may generally define an opening inside the housing 3560, with the one or more main supply circuit breakers 3707 and the plurality of processor circuit breakers 3706 attached inside the opening on the rear surface 3558. The housing 3560 may have an access door as shown in FIG. 16I.

In an alternate embodiment, the housing may further include a front surface for attaching the one or more main supply circuit breakers 3707 and the plurality of processor circuit breakers 3706 are attached to the front surface 3556 of the housing 3560.

As shown, the housing 3560 may be a triangular prism shape, but may also be another shape as required.

Figure 16H:
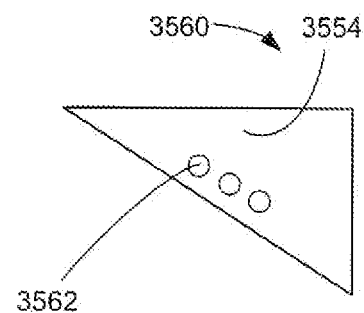
FIG. 16H is a top view of the power distribution panel of FIG. 16G.
Figure 16I:
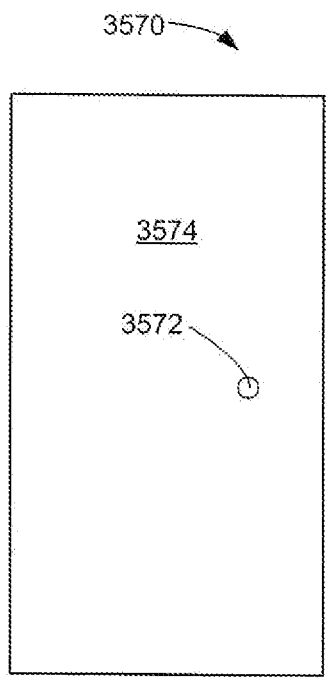
FIG. 16I is a front view of an alternate power distribution panel having a door.

Referring next to FIG. 16H, there is shown a top view 3560 of the housing 3560 of FIG. 16G. The top surface 3554 may have one or more main circuit access openings 3562 on the top surface 3554. The main circuit access openings 3562 may be holes or connectors that provide access for main circuit cabling or wires to deliver power from a power source to the power distribution panel.

Referring next to FIG. 16I, there is shown a front view 3570 of an alternate embodiment of the housing. In this alternate embodiment the housing 3560 does not have a front surface 3556 and generally defines an opening inside the housing, with the one or more main supply circuit breakers 3707 and the plurality of processor circuit breakers 3706 attached inside the opening on the rear surface 3558, with a removable door 3574 including access element 3572, the access element may be a door knob or a button, or another mechanical or electrical locking device for securing the removable door 3574 in place.

Figure 16J:
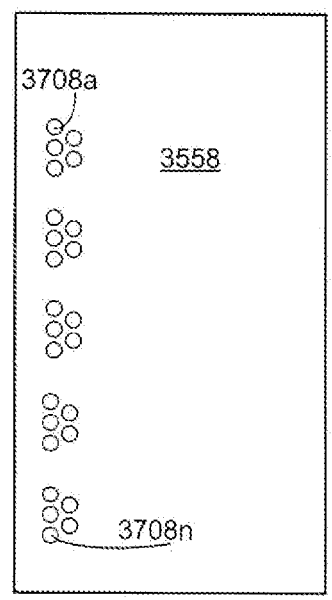
FIG. 16J is a rear view of the power distribution panel of FIG. 16G.

Referring next to FIG. 16J, there is shown a rear view 3580 of the housing 3560 of FIG. 16F. The housing 3560 has a rear surface 3558 with a plurality of processor circuit access openings 3708. The plurality of processor circuit access openings 3708 may be holes or connectors that provide access for main circuit cabling or wires to deliver power from a power source to the power distribution panel.

Figure 17A:
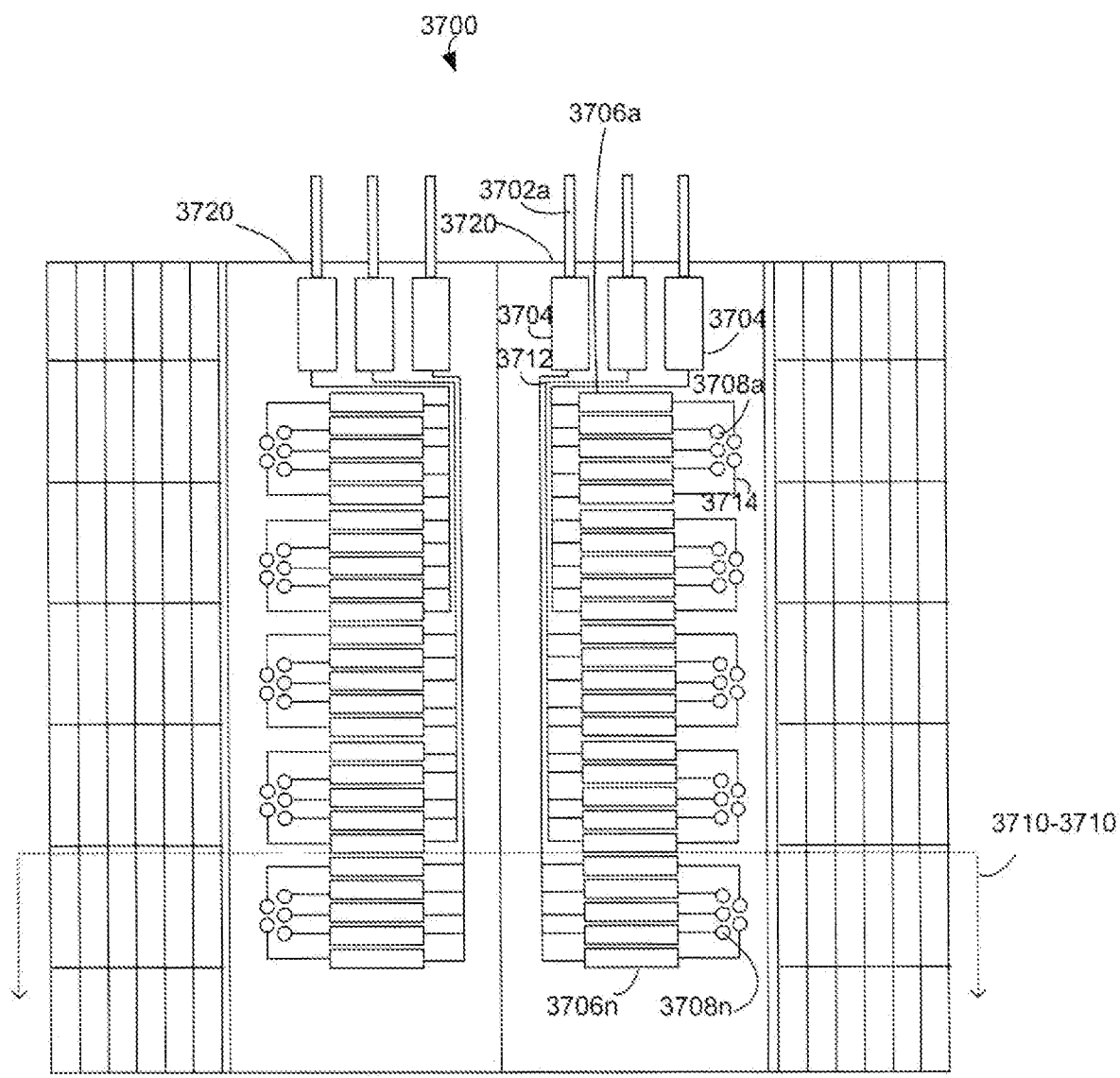
FIG. 17A is a front view of the pair of racks in FIG. 16C showing the pair of integrated power distribution systems of FIG. 16C in a connected configuration.

Referring next to FIG. 17A, there is shown a front view of the pair of racks in FIG. 16A and FIG. 16B showing the pair of integrated power distribution systems 3720 of FIG. 16C in a connected configuration. As shown, main circuits 3702 feed power into the integrated power distribution system 3720 through a main circuit access opening (not shown). The main circuits 3702 may be provided to the integrated power distribution systems 3720 as described in FIG. 7A. In one embodiment, the main circuits 3702 may deliver three individual 1-phase power circuits (as shown). In an alternate embodiment, the main circuits 3702 may be individual phases of a 3-phase power connection. The 3-phase power main may be converted to single phase power using a phase converter or a transformer in the integrated power distribution system (not shown). While three main circuits 3702 and three main circuit breakers 3704 are shown, it is understood that there may be more or less than three. While twenty five processor circuits including twenty five processor circuit breakers 3706, and twenty five processor circuit access openings 3708 are shown, it is understood that there could be more or less than twenty five. The processor circuit openings 3708 are shown as groups of five in this embodiment, corresponding to the number of processor bays shown in FIG. 18B, however the number of processor circuit openings 3708 in each group may vary based on the number of processor bays on each shelf of the rack (see FIG. 4A).

In the case where single phase power is provided to the processor bays, the circuits of the power distribution system 3720 includes a positive circuit, a negative circuit, and a ground circuit. The integrated power distribution system 3720 provides neutral and ground circuits (not shown) interconnecting the main circuits 3702 and the processor circuits. The neutral and ground circuits may be interconnected using a bus bar, or another power interconnection means.

In the embodiment where three-phase power is provided, the circuits of power distribution system 3720 include three positive circuits, a neutral circuit and a ground circuit. In this three-phase embodiment, the power distribution system 3720 may include a transformer or another conversion means to supply single-phase power to the processor circuits from the three-phase power provided from the main circuits 3702.

An input side of the main circuit breakers 3704 is connected to a main circuit 3702. The main circuit breakers operate to electrically isolate the main circuits 3702 from the bus circuits 3712 if an adverse electrical condition is detected. The adverse electrical condition may include a bus circuit short, bus circuit voltage over a threshold, bus circuit voltage under a threshold, or bus circuit current over a threshold. Similarly, the adverse electrical condition may include a main circuit voltage over a threshold, or main circuit voltage under a threshold. The main circuit breakers 3704 may generate an alarm or monitoring signal so that status of each of the breakers can be remotely monitored.

The main circuit breakers 3704 may have an optical coupling (not shown) to allow for the main circuit breakers to be reset remotely.

An output side of the main circuit breakers 3704 is connected to the input side of a processor circuit breaker 3706 via bus circuit 3712. The processor circuit breakers 3706 operate to electrically isolate the bus circuits 3712 from the processor circuits 3714 if an adverse electrical condition is detected. The adverse electrical condition may include a processor circuit short, processor circuit voltage over a threshold, processor circuit voltage under a threshold, or processor circuit current over a threshold. Similarly, the adverse electrical condition may include a bus circuit voltage over a threshold, or bus circuit voltage under a threshold. The processor circuit breakers 3704 may generate an alarm or monitoring signal so that status of each of the breakers can be remotely monitored. The processor circuit breakers 3704 may have an optical coupling (not shown) to allow for the processor circuit breakers to be reset remotely.

An output side of a processor circuit breakers 3706 is directly connected to a processor circuit 3714. The direct connection to processor circuit 3714 may allow for space savings within the constraints of the transportable data center as compared to a processor circuit that plugs into an outlet, socket, or other connector. The processor circuits 3714 may be wires, a bus bar, or another electrical power transmission device that interconnect the processor circuit breaker 3706 to the plurality of processor bays.

Figure 17B:
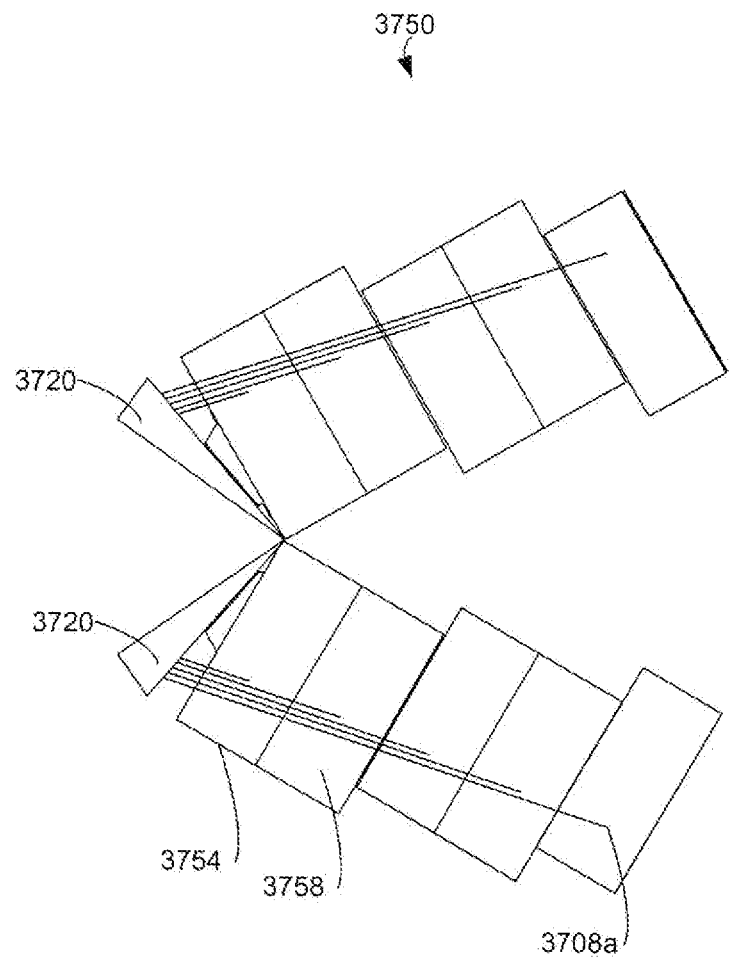
FIG. 17B is a cross section view along the line 3710-3710 in FIG. 17A showing a plurality of processor circuits.

Referring next to FIG. 17B, there is shown a cross section view 3750 along the line 3710-3710 in FIG. 17A showing a plurality of processor circuits. The plurality of processor circuits 3708 extend from the integrated power system 3720 to each of the processor bays in the single shelf level of the rack (see e.g. FIG. 4A). The plurality of processor circuits 3708 distribute power from the integrated power system 3720 to the processor bays.

Referring next to FIG. 18A, there is shown a cutaway portion view 3600 of another transportable datacenter having an evaporative cooling system. The transportable datacenter shown in the cutaway portion view 3600 has two or more racks 3614 inside the transportable datacenter. Intake sidewall 3607 has intake openings 3606, and exhaust sidewall 3608 has exhaust openings 3608. A cold plenum 3602 is generally defined by the end walls (not shown), the intake side of the plurality of processors disposed on racks 3614, and the intake sidewall. Intake fans may be positioned inside the intake openings 3606.

Air from the ambient environment is drawn into the cold plenum using intake fans in the intake openings, and provides cooling as it passes through the plurality of processors in racks 3614, and then the hot exhaust air exhausts the hot plenum 3604 via the exhaust openings 3608 in exhaust sidewall 3610.

The transportable datacenter in FIG. 18A further comprises an evaporative cooling system, having a pump 3617 in fluid communication with a fluid source, a intermediate pipe 3615 in fluid communication with the pump, and one or more output pipes 3612 in fluid communication with the intermediate pipe 3615. The pump 3617 includes a motor, such as an electric motor, an internal combustion engine, or another motor means. The pump 3617 draws fluid from a fluid source, and has an output providing the fluid to the intermediate pipe 3615 at an increased pressure. The one or more output pipes 3612 extend from the intake sidewall 3607. In one embodiment the output pipes 3612 extend generally in front of the intake openings 3606. There may be an output pipe 3612 in front of each intake opening 3606.

The distal end of each of the output pipes 3612 has a nozzle (not shown) for providing a mist, or an aerosol 3616, of the liquid pumped through the evaporative cooling system.

In one embodiment, the fluid used in the evaporative cooling system is water. In another embodiment, other fluids having higher values of enthalpy of vaporization may also be used, such as methanol or ethanol In one embodiment, an optional collection pan 3632 may be provided to recover liquid from the one or more output pipes 3612.

The nozzle of the output pipe 3612 receives pressurized cooling liquid through the output pipe 3612 and the intermediate pipe 3615 from the pump 3617. The received liquid produces a mist 3616 as is exits through the nozzle of the output pipe 3612 into the ambient environment proximate to the intake sidewall 3607. The mist 3616 exits as liquid droplets and evaporates to generate liquid vapor. The evaporation is done using heat from the air in the ambient environment, thus cooling the air proximate to the intake openings 3606 of intake sidewall 3607.

Optionally, a collection pan 3632 may be positioned underneath each of the one or more output pipes 3612 to collect water from the mist 3616 that does not evaporate. The collection pan 3632 may return the water to a reservoir to be reused.

The evaporative cooling system of FIG. 18A may further be used in conjunction with the embodiments of the transportable datacenter shown in FIGS. 1, 2, 3A, 3B, 6, 7A, 10, 11, 12, 13B, 14, 15B, 15D, 16A, and 16B.

Referring next to FIG. 18B there is shown a side view 3630 of the transportable datacenter of FIG. 18A. The transportable container has end wall 110 having access door 124. Extending from the intake sidewall of the transportable container, the one or more output pipes 3612 are shown extending generally parallel to the supporting surface below the transportable container. The output pipes 3612 each have a nozzle at the distal end, and generate a mist 3616 from liquid pressurized through the transmission pipe to the one or more output pipes 3612.

In one embodiment, a collection pan 3632 is positioned below the output pipe 3612 to collect cooling liquid that does not evaporate.

Figure 18C:
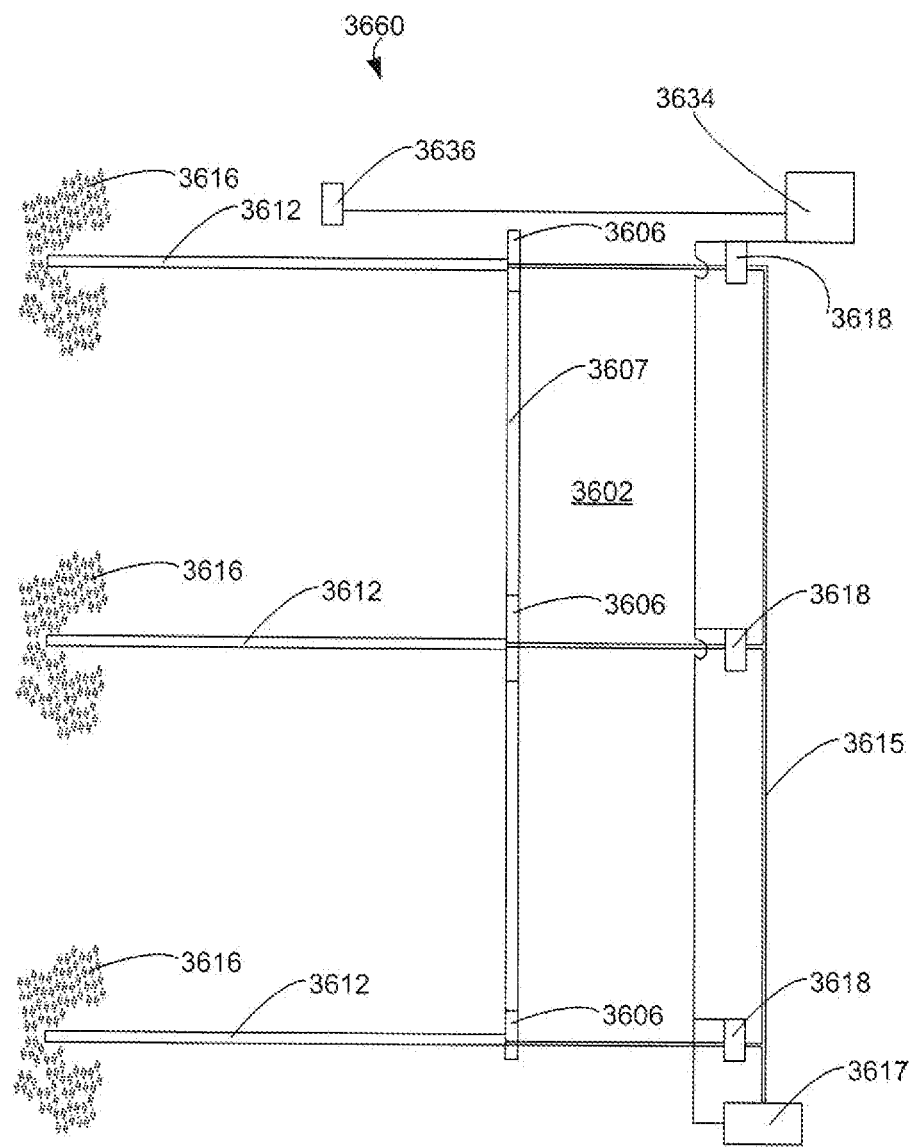
FIG. 18C is a system view of the evaporative cooling system of FIG. 18A.

Referring next to FIG. 18C, there is shown a system view 3660 of the evaporative cooling system of FIG. 18A. The evaporative cooling system has a pump 3617, intermediate pipe 3615, output pipe valves 3618, processor 3634, sensor 3636, one or more output pipes 3612.

The pump 3617 is a liquid pump such as a positive displacement pump, and includes a motor means such as an electric motor or internal combustion engine to drive it. The pump operates to draw liquid from a reservoir or liquid source into an input, and urge the liquid under pressure into the intermediate pipe 3615. The pump may be in communication with the processor 3634, for example, through the use of a relay, in order to enable the processor to programmatically control the operation of the pump. The control of the pump may be simply on/off, or may be a variable speed control.

The intermediate pipe 3615 carries pressurized cooling liquid from the pump 3617 to the one or more output pipes 3612. The intermediate pipe 3615 may be a pipe or hose as is known, including for example polyvinyl chloride (PVC) piping.

Each of the one or more output pipes 3612 carry pressurized cooling liquid from the intermediate pipe 3615 to the distal end of the one or more output pipes 3612. The distal end of the one or more output pipes 3612 includes a nozzle to produce a mist or aerosol 3616 of the cooling liquid in the ambient atmosphere proximate to the intake side of the transportable datacenter.

Each of the one or more output pipes 3612 may have an output pipe valve 3618. The output pipe valve 3618 may have an actuator for operation of the valve to open, close, partially open, or partially close the valve. The closure of the valve may stop the flow of cooling liquid through the output pipe. The actuator for the output pipe valve 3618 may be in communication with the processor 3634. The connection of the processor 3634 with the actuators of the output pipe valves may be done using a solenoid, or similar means, and may allow for the programmatic control of the fluid flow through the output pipes 3612. The output pipe valves 3618 may be independently controlled by the processor 3634, or may be operated together.

Each of the one or more output pipes 3612 may be generally aligned with an intake opening 3606 of the intake sidewall 3607 of the transportable datacenter. The operation of the evaporative cooling system generates a mist or aerosol 3616 of cooling liquid 3616 that evaporates in the ambient atmosphere to cool the ambient air prior to intake into intake openings 3606 of the intake sidewall 3607 of the transportable datacenter.

The sensor 3636 may be a temperature sensor, a light sensor, a humidity sensor, an optical sensor, or a combination of a light sensor, a humidity sensor, and an optical sensor. The sensor 3636 is in communication with the processor 3634 for providing sensor data on the ambient atmosphere.

The processor 3634 may be any computer having one or more processors that can provide processing power for controlling the evaporative cooling system and a memory for storing program instructions. Processor 3634 may be a desktop processor, for example, an Intel® Xeon®, or AMD® Opteron™. In another embodiment, the processor may be an embedded computer system such as an Arduino® or a Raspberry Pi®. In another embodiment, the processor may be a Field-Programmable Gate Array (FPGA), or a purpose built controller. In one embodiment, the processor is a proportional-integral-derivative controller (PID controller) that operates a control loop for the evaporative cooling system.

The processor 3634 receives sensor data from the sensor 3636, and controls the actuators of the valves 3618 of the one or more output pipes 3612 and the pump 3617. The processor control 3634 of the evaporative cooling system may begin cooling as the ambient temperature of the air entering the intake openings exceeds a threshold. Similarly, the processor control 3634 may reduce or disable the evaporative cooling system if the humidity at the intake openings exceeds a threshold.

The processor 3634 may further comprise a network controller. The network controller is any interface that enables the processor 3634 to communicate with other devices and systems. In some embodiments, the network controller can include a serial port, a parallel port, and/or a Universal Serial Bus (USB) port. The network controller 156 may also include at least one of an Internet, Local Area Network (LAN), Ethernet, Firewire, modem, or digital subscriber line connection. Various combinations of these elements may be incorporated within the network controller.

The processor 3634 may be in communication with the one or more intake fans (not shown) and the one or more exhaust fans (not shown) in conjunction with the pump 3617, and the actuator of the output pipe valves 3618. The processor 3634 may function to control the fan speed of the intake fans, and the exhaust fans based on the operation of the output pipe actuators.

Figure 18D:
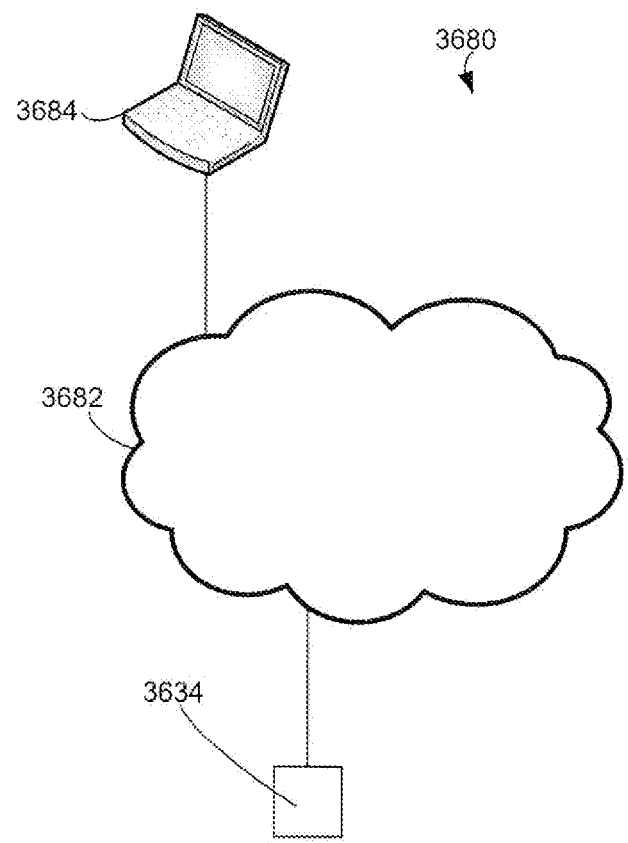
FIG. 18D is a system view of the evaporative cooling system of FIG. 18A.

Referring next to FIG. 18D, there is shown a system diagram 3680 of the evaporative cooling system. The processor 3634 may be available for connection for remote administration via network 3682. A user at user device 3684 may connect to the processor remotely and administer the evaporative cooling system.

The network 3682 may be the Internet, Ethernet, a point to point connection, plain old telephone service (POTS) line, public switch telephone network (PSTN), integrated services digital network (ISDN), digital subscriber line (DSL), coaxial cable, fiber optics, satellite, mobile, wireless (e.g. Wi-Fi, WiMAX), SS7 signaling network, fixed line, local area network, wide area network, and others, including any combination of these, capable of interfacing with, and enabling communication between the processor 3634 and the user device 3684.

The user device 3684 may be a personal computer, a smartphone, an electronic tablet device, a laptop, a workstation, server, portable computer, mobile device, personal digital assistant, Wireless Application Protocol (WAP) phone, an interactive television, video display terminals, gaming consoles, and portable electronic devices. The client system may operate to access the processor using a web browser, or using a client-server application, in order to administer the evaporative cooling system.

The present invention has been described here by way of example and with reference to several example embodiments. These embodiments are merely exemplary and do not limit the scope of the invention, which is limited only by claims.

I claim:

1. A datacenter, comprising:
a plurality of racks, each rack including a plurality of vertically spaced shelves, each shelf having a plurality of horizontally spaced processor bays for receiving corresponding processor devices, each processor bay in the plurality of processor bays having a front face and a rear face, at least some of the racks are arranged in pairs of racks, the pairs of racks including a first pair having a first rack and a second rack;
a cold air plenum adjacent the front faces of the plurality of processor bays;
at least one hot air plenum adjacent the rear faces of the plurality of processor bays; and
a ventilation system to generate an air flow progressively through the cold air plenum, the processor bays, and the at least one hot air plenum,
wherein the racks in at least some of the pairs of racks are arranged at an angle to one another in a horizontal direction to reduce turbulence in the air flow.

2. The datacenter of claim 1 further comprising an electric power system for providing electric power to each of the processor bays, the electric power system including:
an electrical power supply; and
a power cable assembly including a plurality of power cables, each power cable connecting the electrical power supply and a corresponding processor bay in the first pair.

3. The datacenter of claim 2 further comprising a plurality of switches, each switch coupled to a corresponding power cable in the plurality of power cables to selectively enable and disable a supply of electric power to the corresponding processor bay in the first pair.

4. The datacenter of claim 3 further comprising a data network providing network connectivity between an external data communication network and each of the processor bays.

5. The datacenter of claim 1 further comprising a data network providing network connectivity between an external data communication network and each of the processor bays.

6. The datacenter of claim 1 wherein an end of the first rack is at an oblique angle with an end of the second rack.

7. The datacenter of claim 1 wherein the racks in at least some of the pairs of racks are arranged in a v-shaped configuration to reduce the turbulence in the air flow through the pairs of racks arranged in the v-shaped configuration.

8. The datacenter of claim 1 wherein at least some of the processor bays are arranged at an oblique angle to provide a straighter air flow path through the datacenter.

9. The datacenter of claim 1 further including one or more of air intake openings, wherein the cold air plenum is between the front faces of the plurality of processor bays and the air intake openings.

10. The datacenter of claim 9 further including one or more air exhaust openings, wherein each hot air plenum is between the rear faces of one or more of the processor bays and one or more of the air exhaust openings, and wherein the ventilation system includes exhaust fans mounted in at least some of the air exhaust openings, the exhaust fans operable to generate the air flow.

11. The datacenter of claim 9 wherein the ventilation system includes intake fans mounted in at least some of the one or more air intake openings.

12. The datacenter of claim 9, wherein at least some of the pairs of racks are arranged with the rear faces of the processor bays in each rack in the pair adjacent to the same hot air plenum in the at least one hot air plenum.

13. The datacenter of claim 1 wherein at least some of the processor bays have an exhaust flap for channeling air exhaust output from such processor bays into the hot air plenum.

14. The datacenter of claim 13 wherein at least some of the exhaust flaps are angled based on proximity of a corresponding processor bay in the plurality of processor bays to the exhaust air outlets.

15. The datacenter of claim 1 further including a central fan controller for controlling an operation of the ventilation system in response to one or more measured temperatures.

16. A datacenter, comprising:
a plurality of racks, each rack having a plurality of processor bays for receiving a plurality of processor devices, each processor bay in the plurality of processor bays having a front face and a rear face,
a cold air plenum adjacent the front faces of the plurality of processor bays;
at least one hot air plenum adjacent to the rear faces of the plurality of processor bays; and
a ventilation system to generate an air flow progressively through the cold air plenum, the processor bays, and the at least one hot air plenum,
wherein each of the plurality of racks comprises a plurality of horizontally spaced shelves, each shelf having a plurality of horizontally spaced processor bays in the plurality of processor bays, and wherein, at least some of the racks arranged in pairs of racks including:
a first pair of racks comprising a first rack and a second rack, the first rack and the second rack arranged at an angle to one another in a horizontal direction to reduce turbulence in the air flow, and
a second pair of racks comprising a third rack and a fourth rack, the third rack and the fourth rack arranged at an angle to one another in the horizontal direction to reduce turbulence in the air flow.

17. The datacenter of claim 16 further comprising an electric power system for providing electric power to each of the processor bays, the electric power system including:
an electrical power supply; and
a power cable assembly including a plurality of power cables, each power cable connecting the electrical power supply and a corresponding processor bay in the first pair of racks.

18. The datacenter of claim 17 further comprising a plurality of switches, each switch coupled to a corresponding power cable in the plurality of power cables to selectively enable and disable a supply of electric power to the corresponding processor bay in the first pair of racks.

19. The datacenter of claim 18 further comprising a data network providing network connectivity between an external data communication network and each of the processor bays.

20. The datacenter of claim 16 further comprising a data network providing network connectivity between an external data communication network and each of the processor bays.

21. The datacenter of claim 16 further including one or more of air intake openings, wherein the cold air plenum is between the front faces of the processor bays and the air intake openings.

22. The datacenter of claim 16 further including one or more air exhaust openings, wherein each hot air plenum is between the rear faces of one or more of the processor bays and one or more of the air exhaust openings, and wherein the ventilation system includes exhaust fans mounted in at least some of the air exhaust openings, the exhaust fans operable to generate the air flow.

* * * * *